US012514090B2

(12) United States Patent
Kwon et al.

(10) Patent No.: US 12,514,090 B2
(45) Date of Patent: Dec. 30, 2025

(54) DISPLAY DEVICE HAVING OPENINGS WITH SCATTER LAYER AND LINK LAYER THEREIN AND MANUFACTURING METHOD THEREOF

(71) Applicant: Samsung Display Co., LTD., Yongin-si (KR)

(72) Inventors: Youngsoo Kwon, Hwaseong-si (KR); Sun Young Kwon, Seoul (KR); Tae Young Song, Osan-si (KR); Keun Chan Oh, Hwaseong-si (KR); Won-Gap Yoon, Suwon-si (KR); Myung Jin Lee, Hwaseong-si (KR); Hyeok Jin Lee, Seongnam-si (KR); Yongseok Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 699 days.

(21) Appl. No.: 17/859,641

(22) Filed: Jul. 7, 2022

(65) Prior Publication Data
US 2023/0139303 A1 May 4, 2023

(30) Foreign Application Priority Data
Nov. 1, 2021 (KR) .......................... 10-2021-0147738

(51) Int. Cl.
*H10K 59/38* (2023.01)
*H10K 59/12* (2023.01)
(Continued)

(52) U.S. Cl.
CPC .............. *H10K 59/38* (2023.02); *H10K 71/00* (2023.02); *H10K 59/1201* (2023.02); *H10K 59/122* (2023.02)

(58) Field of Classification Search
CPC ...... H10K 59/38; H10K 50/844; H10K 71/00; H10K 50/11; H10K 50/182; H10K 59/122;
(Continued)

(56) References Cited

U.S. PATENT DOCUMENTS 10,573,813 B2 * 2/2020 Jia ......................... H10K 71/441
11,214,699 B2 * 1/2022 Choi ....................... H10K 71/15
(Continued)

FOREIGN PATENT DOCUMENTS

KR 20120098173 A 9/2012
KR 10-2016-0084557 7/2016
(Continued)

OTHER PUBLICATIONS

Extended European Search Report for European Patent Application No. 22203776.4, dated Mar. 13, 2023.

*Primary Examiner* — Caleb E Henry
(74) *Attorney, Agent, or Firm* — CANTOR COLBURN LLP

(57) ABSTRACT

A manufacturing method of a display device according to an embodiment includes forming a bank separating a first opening, a second opening, and a third opening on a first substrate, forming a scatterer layer in the first opening, the second opening, and the third opening, forming a first ink layer in the first opening, forming a second ink layer in the second opening, and forming a third ink layer in the third opening.

15 Claims, 22 Drawing Sheets

(51) Int. Cl.
*H10K 59/122* (2023.01)
*H10K 71/00* (2023.01)

(58) Field of Classification Search
CPC ...... H10K 71/12; H10K 71/135; H10K 71/15; H10K 59/1201; H10K 50/854; H10K 2102/331; C09D 11/38; C09D 11/50; C09D 11/52; C09K 11/06; C09K 2211/10; C09K 11/02; H01L 24/95; H01L 33/44; H01L 33/62; H01L 2224/95085; H01L 25/0753; H01L 33/0095; H01L 33/20; H01L 33/26; H01L 51/56; H01L 51/5287; H01L 51/5012; H01L 51/0003; H01L 27/3246; H01L 51/0005; H01L 51/0007; H01L 51/525; H01L 51/5253
See application file for complete search history.

(56) References Cited

U.S. PATENT DOCUMENTS

| | | | | |
|---|---|---|---|---|
| 11,597,848 B2* | 3/2023 | Sim | | C09D 11/50 |
| 2001/0003602 A1* | 6/2001 | Fujita | | H10K 50/11 |
| | | | | 427/64 |
| 2003/0012870 A1* | 1/2003 | Sakurada | | G02B 5/201 |
| | | | | 359/896 |
| 2007/0001608 A1* | 1/2007 | Lee | | H01J 29/864 |
| | | | | 313/587 |
| 2009/0152509 A1* | 6/2009 | Choi | | C09D 11/52 |
| | | | | 252/511 |
| 2011/0084290 A1 | 4/2011 | Nakamura et al. | | |
| 2012/0021547 A1* | 1/2012 | Kawanishi | | C09D 11/38 |
| | | | | 257/E51.024 |
| 2016/0062178 A1 | 3/2016 | Kim et al. | | |
| 2016/0126499 A1* | 5/2016 | Dai | | H10K 59/875 |
| | | | | 257/40 |
| 2018/0102449 A1* | 4/2018 | Pschenitzka | | G02F 1/133528 |
| 2019/0025655 A1 | 1/2019 | Kim et al. | | |
| 2020/0017704 A1 | 1/2020 | Yang et al. | | |
| 2020/0066803 A1 | 2/2020 | Kim et al. | | |
| 2020/0114658 A1* | 4/2020 | Sakaguchi | | B41J 2/41 |
| 2020/0308435 A1* | 10/2020 | Kim | | C09D 11/36 |
| 2020/0326597 A1* | 10/2020 | Rogojina | | C09K 11/62 |
| 2021/0005672 A1 | 1/2021 | Lee et al. | | |
| 2021/0009826 A1 | 1/2021 | Kizaki et al. | | |
| 2021/0028327 A1 | 1/2021 | Lin et al. | | |
| 2021/0036253 A1* | 2/2021 | Asaoka | | H10K 71/135 |
| 2021/0179876 A1* | 6/2021 | Li | | H10K 85/636 |
| 2021/0269662 A1* | 9/2021 | Sim | | C09D 11/033 |
| 2021/0332256 A1* | 10/2021 | Sim | | C09D 11/50 |
| 2022/0052119 A1 | 2/2022 | Yoon et al. | | |
| 2022/0069158 A1* | 3/2022 | Jung | | C09D 11/36 |
| 2022/0204796 A1* | 6/2022 | Jung | | C09D 11/38 |
| 2022/0310976 A1 | 9/2022 | Lee et al. | | |

FOREIGN PATENT DOCUMENTS

| | | |
|---|---|---|
| KR | 20190009871 A | 1/2019 |
| KR | 20200006652 A | 1/2020 |
| KR | 20200084328 A | 7/2020 |
| KR | 10-2020-0109795 | 9/2020 |
| KR | 10-2153733 | 9/2020 |
| KR | 20210003993 A | 1/2021 |

* cited by examiner

DISPLAY DEVICE HAVING OPENINGS WITH SCATTER LAYER AND LINK LAYER THEREIN AND MANUFACTURING METHOD THEREOF

CROSS-REFERENCE TO RELATED APPLICATION(S)

This application claims priority to and benefits of Korean Patent Application No. 10-2021-0147738 under 35 U.S.C. § 119, filed in the Korean Intellectual Property Office (KIPO) on Nov. 1, 2021, the entire contents of which are incorporated herein by reference.

BACKGROUND

1. Technical Field

The disclosure relates to a display device and a manufacturing method thereof.

2. Description of the Related Art

A display device is a device for displaying an image, and may include a liquid crystal display (LCD), an organic light emitting diode (OLED) display, and the like. A display device may be used in various electronic devices such as a mobile phone, a navigation device, a digital camera, an electronic book, a portable game machine, and various terminals.

An organic light emitting display device may include two electrodes and an organic light emitting layer interposed therebetween, wherein electrons injected from one electrode and holes injected from another electrode may be combined in the organic light emitting layer to generate excitons. The generated excitons may be changed to a ground state from an excited state, releasing energy to emit light.

Recently, a display device including a color conversion panel has been proposed to reduce light loss and implement a display device with high color reproducibility. The color conversion panel may include a color conversion layer including semiconductor nanocrystals such as quantum dots, and may convert incident light into light of different colors. The color conversion layer may further include a scatterer.

The color conversion layer of such a color conversion panel may be formed through an inkjet printing process. Sedimentation and agglomeration of the scatterers may occur in an ink, and they may be adsorbed on an inner wall of a nozzle of an inkjet printing device, causing the nozzle to become clogged. Accordingly, in the inkjet printing process, ink error-landing defects or changes in content of scatterers depending on nozzle positions may occur, and stains may occur on the color conversion panel.

The above information disclosed in this Background section is only for enhancement of understanding of the background of the described technology. Accordingly, this section may contain information that does not form prior art known to a person of ordinary skill in the art prior to a corresponding effective filing date of the subject matter disclosed herein.

SUMMARY

Embodiments provide a display device and a manufacturing method thereof that may solve a problem caused by a scatterer being precipitated in an ink or adsorbed on an inner wall of a nozzle by forming a scatterer layer in a separate process.

An embodiment provides a manufacturing method of a display device that may include forming a bank separating a first opening, a second opening, and a third opening on a first substrate, forming a scatterer layer in the first opening, the second opening, and the third opening, forming a first ink layer in the first opening, forming a second ink layer in the second opening, and forming a third ink layer in the third opening.

The scatterer layer and the first ink layer may be mixed to form a first color conversion layer in the first opening, the scatterer layer and the second ink layer may be mixed to form a second color conversion layer in the second opening, and the scatterer layer and the third ink layer may be mixed to form a transmission layer in the third opening.

The forming of the scatterer layer may include coating a scatterer solution entirely on the first substrate, and forming a scatterer layer by drying the scatterer solution.

The scatterer solution may include a volatile solvent, a first monomer, and a scatterer, and in case that the scatterer solution is dried, the volatile solvent may evaporate, and the scatterer layer may include the first monomer and the scatterer.

The volatile solvent may include at least one of chloroform, acetone, propylene glycol methyl ether acetate ether acetate (PGMEA), and propylene glycol monomethyl ether (PGME).

The first monomer may include an organic material provided with an acrylate functional group at at least one end portion of the organic material.

The scatterer may include at least one of titanium oxide ($TiO_2$), silicon oxide ($SiO_2$), barium sulfate ($BaSO_4$), zinc oxide (ZnO), aluminum oxide ($Al_2O_3$), and calcium carbonate ($CaCO_3$).

The scatterer may be further disposed on the bank.

The first ink layer may include a first quantum dot, a second monomer, and a photoinitiator, the second ink layer may include a second quantum dot, the second monomer, and the photoinitiator, the third ink layer may include the second monomer and the photoinitiator, and the first ink layer, the second ink layer, and the third ink layer may not include a scatterer.

The first monomer and the second monomer may include different materials.

The second monomer may include an organic material provided with an acrylate functional group at at least one end portion of the organic material.

The coating of the scatterer solution may be performed by using at least one of an electrospray process, a screen printing process, and a blade coating process.

The forming of the first ink layer, the second ink layer, and the third ink layer may be performed by using an inkjet printing process.

The manufacturing method of the display device may further include photocuring the first color conversion layer, the second color conversion layer, and the transmission layer, and thermal-curing the first color conversion layer, the second color conversion layer, and the transmission layer.

The manufacturing method of the display device may further include forming a first color filter, a second color filter, and a third color filter on the first substrate. The first color filter may overlap the first color conversion layer in a plan view, the second color filter may overlap the second color conversion layer in a plan view, and the third color filter may overlap the transmissive layer in a plan view.

The manufacturing method of the display device may further include forming light emitting elements on a second substrate, aligning the first substrate and the second substrate to face each other, and bonding the first substrate and the second substrate together.

Another embodiment provides a display device that may include a first substrate, a bank that may be disposed on the first substrate, the bank separating a first opening, a second opening, and a third opening, a first color conversion layer that may be disposed in the first opening and includes a first quantum dot and a scatterer, a second color conversion layer that may be disposed in the second opening and includes a second quantum dot and the scatterer, and a transmission layer that may be disposed in the third opening and includes the scatterer, wherein the scatterer may be further positioned on the bank.

Each of the first color conversion layer, the second color conversion layer, and the transmission layer may include a first monomer and a second monomer, and each of the first monomer and the second monomer may include an organic material having an acrylate functional group at at least one end portion of the organic material.

The first monomer and the second monomer may include different materials.

The display device may further include a first color filter, a second color filter, and a third color filter disposed on the first substrate, a second substrate facing the first substrate, and light emitting elements disposed on the second substrate, wherein the first color filter may overlap the first color conversion layer in a plan view, the second color filter may overlap the second color conversion layer in a plan view, and the third color filter may overlap the transmission layer in a plan view.

According to the embodiments, by forming a scatterer layer in a separate process, it may be possible to solve a problem caused by a scatterer being precipitated in an ink or adsorbed to an inner wall of a nozzle.

DETAILED DESCRIPTION OF THE EMBODIMENTS

Figure 1:
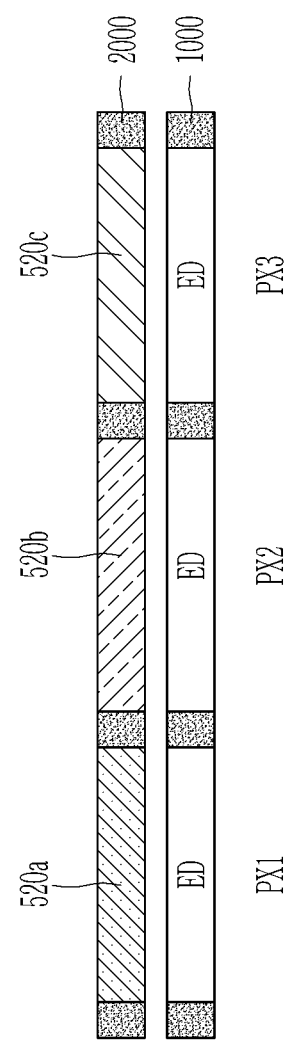
FIG. 1 illustrates a schematic cross-sectional view of a display device according to an embodiment.

The disclosure will be described more fully hereinafter with reference to the accompanying drawings, in which embodiments of the disclosure are shown. As those skilled in the art would realize, the described embodiments may be modified in various ways, all without departing from the spirit or scope of the disclosure.

As used herein, the singular forms, "a," "an," and "the" are intended to include the plural forms as well, unless the context clearly indicates otherwise.

In order to clearly describe the disclosure, parts or portions that may be irrelevant to the description may be omitted, and identical or similar constituent elements throughout the specification are denoted by the same reference numerals.

Further, in the drawings, the size and thickness of each element may be arbitrarily illustrated for ease of description, and the disclosure is not necessarily limited to those illustrated in the drawings. In the drawings, the thicknesses of layers, films, panels, regions, areas, etc., may be exaggerated for clarity. In the drawings, for ease of description, the thicknesses of some layers and areas may be exaggerated.

It will be understood that when an element such as a layer, film, region, area, or substrate is referred to as being "on" another element, it can be directly on the other element or intervening elements may also be present. In contrast, when an element is referred to as being "directly on" another element, there may be no intervening elements present. Further, in the specification, the word "on" or "above" means positioned on or below the object portion, and does not necessarily mean positioned on the upper side of the object portion based on a gravitational direction.

Unless explicitly described to the contrary, the words "comprise", "has", and "includes", and variations such as "comprises", "comprising", "have", "having", "includes", and "including" will be understood to imply the inclusion of stated elements but not the exclusion of any other elements.

Further, throughout the specification, the phrase "in a plan view" or "on a plane" may mean viewing a target portion from the top, and the phrase "in a cross-sectional view" or "on a cross-section" may mean viewing a cross-section formed by vertically cutting a target portion from the side.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment will be described with reference to FIG. 1 to FIG. 3.

Figure 2:
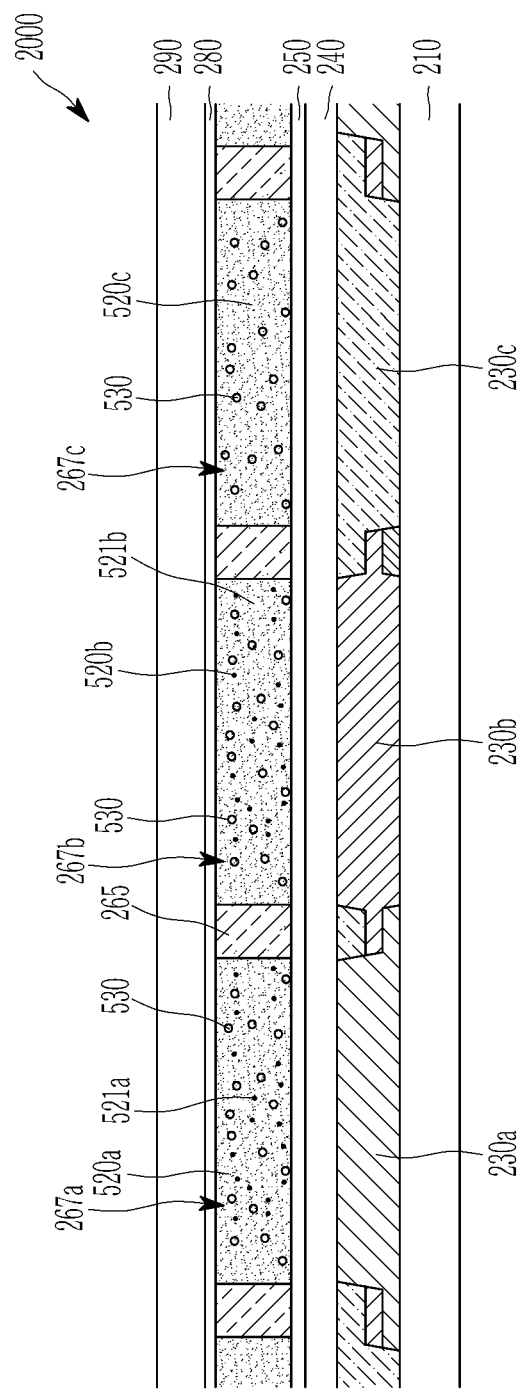
FIG. 2 illustrates a schematic cross-sectional view of a portion of a display device according to an embodiment.
Figure 3:
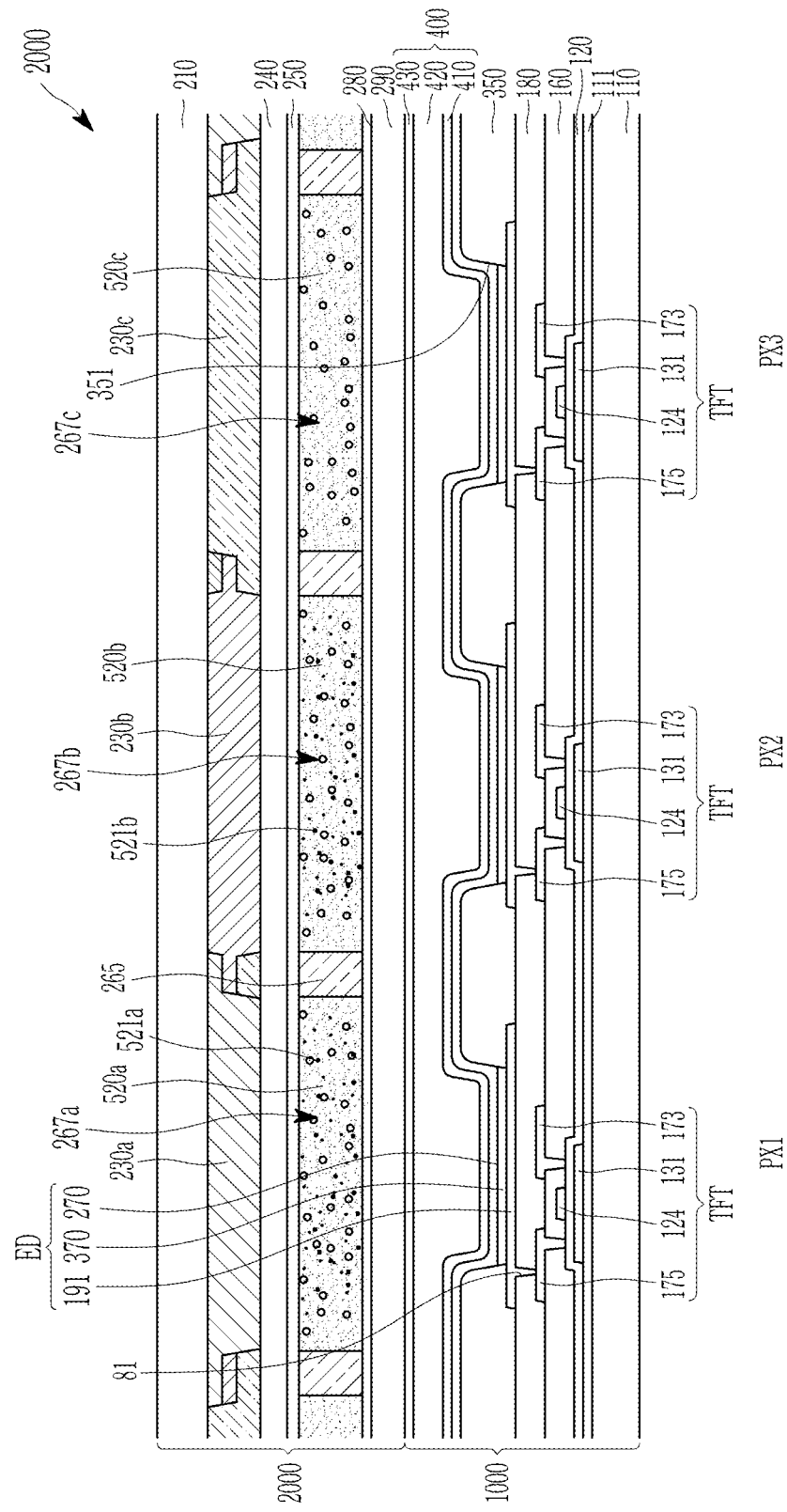
FIG. 3 illustrates a schematic cross-sectional view of a display device according to an embodiment.

FIG. 1 illustrates a schematic cross-sectional view of a display device according to an embodiment, FIG. 2 illustrates a schematic cross-sectional view of a portion of a display device according to an embodiment, and FIG. 3 illustrates a schematic cross-sectional view of a display device according to an embodiment. FIG. 2 illustrates a color conversion panel of a display device according to an embodiment.

As shown in FIG. 1, a display device according to an embodiment includes a display panel 1000 and a color conversion panel 2000 overlapping each other.

The display panel 1000 may include pixels PX1, PX2, and PX3, and a light-emitting element ED may be positioned for each pixel PX1, PX2, or PX3. For example, the display panel 1000 may include multiple light emitting elements ED. The pixels PX1, PX2, and PX3 may include a first pixel PX1, a second pixel PX2, and a third pixel PX3. Each of the light emitting elements ED may emit light, and the display panel 1000 may display a screen by adjusting the light emitted from the light emitting element ED of each of the pixels PX1, PX2, and PX3.

A light emitting element ED may be formed of an organic light emitting element, and the display panel 1000 may be formed of an organic light emitting panel. However, the type of the display panel 1000 is not limited thereto, and the display panel 1000 may be formed as various types of panels. For example, the display panel 1000 may be formed as a liquid crystal panel, an electrophoretic display panel, an electrowetting display panel, or the like. The display panel 1000 may be formed as a next-generation display panel such as a micro light emitting diode (micro LED) display panel.

The display panel 1000 may be formed as a flat rigid display panel or a flexible display panel that may be flexibly bent.

The color conversion panel 2000 may be disposed to face the display panel 1000. The color conversion panel 2000 may include a first color conversion layer 520a, a second color conversion layer 520b, and a transmission layer 520c. The first color conversion layer 520a may overlap the light emitting element ED positioned in the first pixel PX1. Light emitted from the light emitting element ED of the first pixel PX1 may pass through the first color conversion layer 520a to emit light of a first wavelength. The second color conversion layer 520b may overlap the light emitting element ED positioned in the second pixel PX2. Light emitted from the light emitting element ED of the second pixel PX2 may pass through the second color conversion layer 520b to emit light of a second wavelength. The transmission layer 520c may overlap the light emitting element ED positioned in the third pixel PX3. Light emitted from the light emitting element ED of the third pixel PX3 may pass through the transmission layer 520c to emit light of a third wavelength. For example, the light of the first wavelength may be red light, the light of the second wavelength may be green light, and the light of the third wavelength may be blue light. For example, the first pixel PX1, the second pixel PX2, and the third pixel PX3 may be a red pixel, a green pixel, and a blue pixel, respectively. However, the disclosure is not limited thereto, and colors displayed by the first pixel PX1, the second pixel PX2, and the third pixel PX3 may be variously changed. Further, in addition to the first pixel PX1, the second pixel PX2, and the third pixel PX3, a pixel displaying another color may be additionally included.

Hereinafter, a stacked structure of the color conversion panel of the display device according to an embodiment will be described with reference to FIG. 2 and FIG. 3.

The color conversion panel 2000 may include a substrate 210, and a first color filter 230a, a second color filter 230b, and a third color filter 230c that may be positioned on the substrate 210.

The first color filter 230a may transmit the light of the first wavelength and absorb the light of the remaining wavelengths, thereby increasing purity of the light of the first wavelength emitted to the outside of the display device.

The second color filter 230b may transmit the light of the second wavelength and absorb the light of the remaining wavelengths, thereby increasing purity of the light of the second wavelength emitted to the outside of the display device.

The third color filter 230c may transmit the light of the third wavelength and absorb the light of the remaining wavelengths, thereby increasing purity of the light of the third wavelength emitted to the outside of the display device.

The first color filter 230a, the second color filter 230b, and the third color filter 230c may be positioned to respectively overlap the pixels PX1, PX2, and PX3, which may be different from each other. At boundaries of respective pixels PX1, PX2, and PX3, the first color filter 230a, the second color filter 230b, and the third color filter 230c may overlap each other to form a light blocking area. Although it is illustrated that the first color filter 230a, the second color filter 230b, and the third color filter 230c all overlap in the light blocking area, the disclosure is not limited thereto. For example, two of the first color filter 230a, the second color filter 230b, and the third color filter 230c may overlap each other to form a light blocking area. For example, at a boundary between the first pixel PX1 and the second pixel PX2, the first color filter 230a and the second color filter 230b may overlap each other. At a boundary between the second pixel PX2 and the third pixel PX3, the second color filter 230b and the third color filter 230c may overlap each other. At a boundary between the third pixel PX3 and the first pixel PX1, the third color filter 230c and the first color filter 230a may overlap each other.

A low refractive index layer 240 may be positioned on the first color filter 230a, the second color filter 230b, and the third color filter 230c. The low refractive index layer 240 may overlap all of the first color filter 230a, the second color filter 230b, and the third color filter 230c. The low refractive index layer 240 may be entirely positioned on the substrate 210. The low refractive index layer 240 may include an organic material or inorganic material having a low refractive index. For example, a refractive index of the low refractive index layer 240 may be about 1.1 or more and about 1.3 or less.

A first capping layer 250 may be positioned on the low refractive index layer 240. The first capping layer 250 may be a layer for protecting the low refractive index layer 240, and may include an inorganic insulation material such as a silicon nitride (SiNx), a silicon oxide (SiOx), a silicon oxynitride (SiOxNy), or a combination thereof. The first capping layer 250 may have a single-layered structure or multi-layered structure of the above-described material.

A partition wall or bank 265 may be positioned on the first capping layer 250. The bank 265 may include a first opening 267a overlapping the first color filter 230a, a second opening 267b overlapping the second color filter 230b, and a third opening 267c overlapping the third color filter 230c. The first opening 267a may overlap a light emitting area of the first pixel PX1, the second opening 267b may overlap a light emitting area of the second pixel PX2, and the third opening 267c may overlap a light emitting area of the third pixel PX3. The bank 265 may overlap a light blocking area in which the first color filter 230a, the second color filter 230b, and the third color filter 230c may overlap each other. Accordingly, the bank 265 may overlap boundaries between respective pixels PX1, PX2, and PX3.

The first color conversion layer 520a may be positioned in the first opening 267a, the second color conversion layer 520b may be positioned in the second opening 267b, and the transmission layer 520c may be positioned in the third opening 267c.

The first color conversion layer 520a may overlap the first color filter 230a. The first color conversion layer 520a may not overlap the second color filter 230b and the third color filter 230c. The first color conversion layer 520a may convert light incident from the light emitting element ED of the first pixel PX1 into light of the first wavelength. The light of the first wavelength may be red light having a maximum light emitting peak wavelength of about 600 nm to about 650 nm, for example, about 620 nm to about 650 nm. The first color conversion layer 520a may include first quantum dots 521a and scatterers 530.

The second color conversion layer 520b may overlap the second color filter 230b. The second color conversion layer 520b may not overlap the first color filter 230a and the third color filter 230c. The second color conversion layer 520b may convert light incident from the light emitting element ED of the second pixel PX2 into light of the second wavelength. The light of the second wavelength may be green light having a maximum light emitting peak wavelength of about 500 nm to about 550 nm, for example, about 510 nm to about 550 nm. The second color conversion layer 520b may include first quantum dots 521b and scatterers 530.

The transmission layer 520c may overlap the third color filter 230c. The transmission layer 520c may not overlap the first color filter 230a and the second color filter 230b. The transmission layer 520c may transmit light incident from the light emitting element ED of the third pixel PX3. The light transmitting through the transmission layer 520c may be light of the third wavelength. The light of the third wavelength may be blue light having a maximum light emitting peak wavelength of about 380 nm to about 480 nm, for example, about 420 nm or more, about 430 nm or more, about 440 nm or more, or about 445 nm or more, and about 470 nm or less, about 460 nm or less, or about 455 nm or less. The transmission layer 520c may include scatterers 530.

The scatterers 530 may scatter light incident on the first color conversion layer 520a, the second color conversion layer 520b, and the transmission layer 520c to improve light efficiency. The scatterer 530 may include at least one material such as $TiO_2$, $SiO_2$, $BaSO_4$, $ZnO$, $Al_2O_3$, and $CaCO_3$. A particle size of the scatterer 530 may be greater than or equal to about 50 nm and less than or equal to about 800 nm.

Each of the first quantum dot 521a and the second quantum dot 521b (hereinafter, also referred to as semiconductor nanocrystal) may independently include a group II-VI compound, a group III-V compound, a group IV-VI compound, a group IV element or compound, a group I-III-VI compound, a group II-III-VI compound, a group I-II-IV-VI compound, or a combination thereof. The quantum dot may not include cadmium.

The group II-VI compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group II-VI compound may further include a group III metal.

The group III-V compound may be selected from a binary element compound selected from GaN, GaP, GaAs, GaSb, AN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The group III-V compound may further include a group II metal (for example, InZnP).

The group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof.

The group IV element or compound may be selected from a singular element compound selected from Si, Ge, and a combination thereof, and a binary element compound selected from SiC, SiGe, and a combination thereof, but is not limited thereto.

The group I-III-VI compound includes, for example, $CuInSe_2$, $CuInS_2$, CuInGaSe, and CuInGaS, but is not limited thereto. The group I-II-IV-VI compound includes, for example, CuZnSnSe and CuZnSnS, but is not limited thereto. The group IV element or compound may be selected from a singular element selected from Si, Ge, and a mixture thereof, and a binary element compound selected from SiC, SiGe, and a mixture thereof.

The group II-III-VI compounds may be selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but is not limited thereto.

The group I-II-IV-VI compound may be selected from CuZnSnSe and CuZnSnS, but is not limited thereto.

In an embodiment, the quantum dot may not include cadmium. The quantum dot may include a semiconductor nanocrystal based on a group III-V compound including indium and phosphorus. The group III-V compound may further include zinc. The quantum dot may include a semiconductor nanocrystal based on a group II-VI compound including a chalcogen element (for example, sulfur, selenium, tellurium, or a combination thereof) and zinc.

In the quantum dot, the binary element compound, the ternary element compound, and/or the quaternary element compound, which are described above, may be present in particles at uniform concentrations, or they may be divided into states having partially different concentrations to be present in the same particle, respectively. A core/shell structure in which some quantum dots enclose other quantum dots may be possible. An interface between the core and the shell may have a concentration gradient in which a concentration of elements of the shell decreases closer to its center.

In some embodiments, the quantum dot may have a core-shell structure that includes a core including the nanocrystal described above and a shell surrounding the core. The shell of the quantum dot may serve as a passivation layer for maintaining a semiconductor characteristic and/or as a charging layer for applying an electrophoretic characteristic to the quantum dot by preventing chemical denaturation of the core. The shell may be a single layer or a multilayer. An interface between the core and the shell may have a concentration gradient in which a concentration of elements of the shell decreases closer to its center. An example of the shell of the quantum dot may include a metal or nonmetal oxide, a semiconductor compound, or a combination thereof.

For example, the metal or non-metal oxide may be a binary element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a ternary element compound such as $MgAl_2O_4$, $CoFe_2O_4$, $NiFe_2O_4$, $CoMn_2O_4$, and the like, but the disclosure is not limited thereto.

The semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the disclosure is not limited thereto.

An interface between the core and the shell may have a concentration gradient in which a concentration of elements of the shell decreases closer to its center. The semiconductor nanocrystal may have a structure including one semiconductor nanocrystal core and a multi-layered shell surrounding the semiconductor nanocrystal core. In an embodiment, the multi-layered shell may have two or more layers, for example, two, three, four, five, or more layers. Two adjacent layers of the shell may have a single composition or different compositions. In the multi-layered shell, each layer may have a composition that varies along a radius.

The quantum dot may have a full width at half maximum (FWHM) of the light-emitting wavelength spectrum that may be equal to or less than about 45 nm, as an example equal to or less than about 40 nm, and as another example equal to or less than about 30 nm, and in this range, color purity or color reproducibility may be improved. Since light emitted through the quantum dot may be emitted in all directions, a viewing angle of light may be improved.

In the quantum dot, the shell material and the core material may have different energy bandgaps. For example, the energy bandgap of the shell material may be greater than that of the core material. In another embodiment, the energy bandgap of the shell material may be smaller than that of the core material. The quantum dot may have a multi-layered shell. In the multi-layered shell, an energy bandgap of an outer layer thereof may be larger than that of an inner layer thereof (for example, a layer closer to the core). In the multi-layered shell, the energy bandgap of the outer layer may be smaller than the energy bandgap of the inner layer.

The quantum dot may adjust an absorption/emission wavelength by adjusting a composition and size thereof. The maximum emission peak wavelength of the quantum dot may have a wavelength range from ultraviolet to infrared wavelengths or more.

The quantum dot may include an organic ligand (for example, having a hydrophobic moiety and/or a hydrophilic moiety). The organic ligand moiety may be bound to a surface of the quantum dot. The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R may be independently a C3 to C40 substituted or unsubstituted aliphatic hydrocarbon group such as a C3 to C40 (for example, C5 or greater and C24 or less) substituted or unsubstituted alkyl, or a substituted or unsubstituted alkenyl, a C6 to C40 (for example, C6 or greater and C20 or less) substituted or unsubstituted aromatic hydrocarbon group such as a substituted or unsubstituted C6 to C40 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentylphosphine, octylphosphine, dioctyl phosphine, tributylphosphine, or trioctylphosphine; a phosphine compound or an oxide compound thereof such methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, or trioctylphosphine oxide; a diphenyl phosphine, a triphenyl phosphine compound, or an oxide compound thereof; a C5 to C20 alkyl phosphonic acid such as hexyl phosphinic acid, octylphosphinic acid, dodecanephosphinic acid, tetradecanephosphinic acid, hexadecanephosphinic acid, octadecanephosphinic acid; and the like, but are not limited thereto. The quantum dot may include a hydrophobic organic ligand alone or in a mixture of at least one type. The hydrophobic organic ligand may not include a photopolymerizable moiety (for example, an acrylate group, a methacrylate group, etc.).

Each of the first color conversion layer 520a, the second color conversion layer 520b, and the transmission layer 520c may further include a monomer. The monomer may be made of a non-volatile monomer, and may be made of an organic material for photocuring. The monomer may have an acrylate functional group at one end portion or both end portions thereof. The monomer may have a boiling point of about 200° C. or higher and a vapor pressure of about $10^{-2}$ mmHg or less.

Each of the first color conversion layer 520a, the second color conversion layer 520b, and the transmission layer 520c may include two or more different monomers. For example, each of the first color conversion layer 520a, the second color conversion layer 520b, and the transmission layer 520c may include a first monomer and a second monomer. The first monomer and the second monomer may include different materials. Each of the first monomer and the second monomer may have an acrylate functional group at one end portion or both end portions thereof.

A second capping layer 280 may be positioned on the first color conversion layer 520a, the second color conversion layer 520b, the transmission layer 520c, and the bank 265. The second capping layer 280 may be entirely positioned on the substrate 210. The second capping layer 280 may cover and protect the first color conversion layer 520a, the second color conversion layer 520b, and the transmission layer 520c, and may be made of an inorganic material. For example, the second capping layer 280 may include an inorganic insulation material such as a silicon nitride (SiNx), a silicon oxide (SiOx), a silicon oxynitride (SiOxNy), or a combination thereof. The second capping layer 280 may have a single-layered structure or multi-layered structure of the above-described material.

A filling layer 290 may be positioned on the second capping layer 280. The filling layer 290 may be entirely positioned on the substrate 210. The filling layer 290 may be positioned between the display panel 1000 and the color conversion panel 2000 in a state in which the display panel 1000 and the color conversion panel 2000 may be bonded to each other.

Hereinafter, a state in which the display panel 1000 and the color conversion panel 2000 may be bonded to each other will be described with reference to FIG. 3. In FIG. 3, the color conversion panel 2000 shown in FIG. 2, in an upside-down state, may be coupled to the display panel 1000 to face the display panel 1000.

The display panel 1000 may include a substrate 110, and a transistor TFT that may include a semiconductor 131, a gate electrode 124, a source electrode 173, and a drain electrode 175, a gate insulating layer 120, a first interlayer insulating layer 160, a second interlayer insulating layer 180, a pixel electrode 191, a light emitting layer 370, a bank layer 350, a common electrode 270, and an encapsulation layer 400, which may be positioned on the substrate 110.

The substrate 110 may include a material having a rigid characteristic, such as glass, or a flexible material that may be bent, such as plastic and polyimide. A buffer layer 111 for flattening a surface of the substrate 110 and blocking impurities from penetrating into the semiconductor 131 may be further disposed on the substrate 110. The buffer layer 111 may include an inorganic material, for example, an inorganic insulation material such as a silicon nitride (SiNx), a silicon oxide (SiOx), silicon oxynitride (SiOxNy), or a combination thereof. The buffer layer 111 may have a single-layered structure or a multi-layered structure of the above-described material. A barrier layer (not shown) may be further disposed on the substrate 110. The barrier layer may be disposed between the substrate 110 and the buffer layer 111. The barrier layer may include an inorganic insulation material such as a silicon nitride (SiNx), a silicon oxide (SiOx), a silicon oxynitride (SiOxNy), or a combination thereof. A barrier layer BA may have a single-layered structure or a multi-layered structure of the above-described material.

The semiconductor 131 may be disposed on the substrate 110. The semiconductor 131 may include at least one of an amorphous silicon, a polycrystalline silicon, and an oxide semiconductor. For example, the semiconductor 131 may include a low temperature polycrystalline silicon (LTPS), or an oxide semiconductor material including at least one of zinc (Zn), indium (In), gallium (Ga), tin (Sn), and a mixture thereof. For example, the semiconductor 131 may include an indium-gallium-zinc oxide (IGZO). The semiconductor 131 may include a channel area, a source area, and a drain area that may be classified according to whether or not impurity doping is performed. The source area and the drain area may have a conductive characteristic corresponding to a conductor.

The gate insulating film 120 may cover the semiconductor 131 and the substrate 110. The gate insulating film 120 may include an inorganic insulation material such as a silicon nitride (SiNx), a silicon oxide (SiOx), a silicon oxynitride (SiOxNy), or a combination thereof. The gate insulating film 120 may have a single-layered or multi-layered structure of the material described above.

The gate electrode 124 may be disposed on the gate insulating film 120. The gate electrode 124 may include a metal such as copper (Cu), molybdenum (Mo), aluminum (Al), silver (Ag), chromium (Cr), tantalum (Ta), and titanium (Ti), or a metal alloy thereof. The gate electrode 124 may be formed as a single layer or a multilayer. An area of the semiconductor 131 that overlaps the gate electrode 124 in a plan view may be a channel area.

The first interlayer insulating film 160 may cover the gate electrode 124 and the gate insulating film 120. The first interlayer insulating film 160 may include an inorganic insulating material such as a silicon nitride (SiNx), a silicon oxide (SiOx), a silicon oxynitride (SiOxNy), or a combination thereof. The first interlayer insulating film 160 may have a single-layered or multi-layered structure of the material described above.

The source electrode 173 and the drain electrode 175 may be disposed on the first interlayer insulating film 160. The source electrode 173 and the drain electrode 175 may be respectively connected to the source area and the drain area of the semiconductor 131 by openings formed in the first interlayer insulating film 160 and the gate insulating film 120. The semiconductor 131, the gate electrode 124, the source electrode 173, and the drain electrode 175 described above may configure one transistor TFT. In some embodiments, the transistor TFT may include only the source and drain areas of the semiconductor 131 instead of the source electrode 173 and the drain electrode 175. Although one transistor TFT may be illustrated in each of the pixels PX1, PX2, and PX3, the disclosure is not limited thereto, and transistors TFT may be positioned in each of the pixels PX1, PX2, and PX3.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), or a metal alloy thereof. The source electrode 173 and the drain electrode 175 may be formed as a single layer or multilayer. The source electrode 173 and drain electrode 175 according to an embodiment may be configured of a triple layer including an upper layer, an intermediate layer, and a lower layer, the upper layer and the lower layer may include titanium (Ti), and the intermediate layer may include aluminum (Al).

The second interlayer insulating film 180 may be disposed on the source electrode 173 and the drain electrode 175. The second interlayer insulating film 180 may cover the source electrode 173, the drain electrode 175, and the first interlayer insulating film 160. The second interlayer insulating film 180 may be for planarizing the surface of the substrate 110 provided with the transistor TFT, and may be an organic insulating film, and may include at least one of a polyimide, a polyamide, an acryl resin, benzocyclobutene, and a phenol resin.

The pixel electrode 191 may be disposed on the second interlayer insulating film 180. The pixel electrode 191 may also be referred to as an anode electrode, and may be formed as a single layer or multilayer that includes a transparent conductive oxide film or a metal material. The transparent conductive oxide film may include an indium tin oxide (ITO), a poly-ITO, an indium zinc oxide (IZO), an indium gallium zinc oxide (IGZO), and an indium tin zinc oxide (ITZO). The metal material may include silver (Ag), molybdenum (Mo), copper (Cu), gold (Au), aluminum (Al), or a combination thereof.

The second interlayer insulating film 180 may include a via hole 81 exposing the drain electrode 175. The drain electrode 175 and the pixel electrode 191 may be physically and electrically connected to each other through the via hole 81 of the second interlayer insulating film 180. Accordingly, the pixel electrode 191 may receive an output current to be transmitted from the drain electrode 175 to the light emitting layer 370.

The bank layer 350 may be disposed on the pixel electrode 191 and the second interlayer insulating film 180. The bank layer 350 may also be referred to as a pixel defining layer (PDL), and may include a pixel opening 351 overlapping at least a portion of the pixel electrode 191. The pixel opening 351 may overlap a central portion of the pixel electrode 191, and may not overlap an edge portion of the pixel electrode 191. Accordingly, a size of the pixel opening 351 may be smaller than that of the pixel electrode 191. The bank layer 350 may partition a formation position of the light emitting layer 370 so that the light emitting layer 370 may be disposed on a portion where an upper surface of the pixel electrode 191 may be exposed. The bank layer 350 may be an organic insulating film including at least one of a polyimide, a polyamide, an acryl resin, benzocyclobutene, and a phenol resin. In some embodiments, the bank layer 350 may be formed as a black pixel defining layer (BPDL) including a black color pigment.

The bank layer 350 may be positioned at a boundary between the pixels PX1, PX2, and PX3. The bank layer 350 may overlap the bank 265. The bank layer 350 may overlap a light blocking area in which the first color filter 230a, the second color filter 230b, and the third color filter 230c overlap each other.

Each of the pixel openings 351 may have a shape similar to that of the pixel electrode 191 in a plan view. For example, the pixel opening 351 and the pixel electrode 191 may be formed to have a polygonal shape in a plan view. Corner portions of the pixel opening 351 and the pixel electrode 191 may be chamfered. However, the shape of the pixel opening 351 and the shape of the pixel electrode 191 are not limited thereto, and may be variously changed.

Pixel electrodes 191 respectively corresponding to the first pixel PX1, the second pixel PX2, and the third pixel PX3 may have different sizes in a plan view. Similarly, pixel openings 351 respectively corresponding to the first pixel PX1, the second pixel PX2, and the third pixel PX3 may have different sizes in a plan view. For example, the pixel opening 351 and the pixel electrode 191 corresponding to the first pixel PX1 may respectively have a larger size than the pixel opening 351 and the pixel electrode 191 corresponding to the second pixel PX2 in a plan view. The pixel opening 351 and pixel electrode 191 corresponding to the first pixel PX1 may respectively have smaller than or similar sizes to the pixel opening 351 and pixel electrode 191 corresponding to the third pixel PX3 in a plan view. However, the disclosure is not limited thereto, and each of the pixel opening 351 and the pixel electrode 191 may be set to have various sizes.

The light emitting layer 370 may be positioned within the pixel opening 351 partitioned by the bank layer 350. However, the disclosure is not limited thereto, and the light emitting layer 370 may be positioned not only within the pixel opening 351 but also on the bank layer 350. For example, the light emitting layer 370 may be entirely formed on the substrate 110. The light emitting layer 370 may be formed by performing a deposition process by using an open mask of which a portion corresponding to the display area may be opened. The light emitting layer 370 may include a low molecular weight or high molecular weight organic material. Although the light emitting layer 370 is illustrated as a single layer, actually, auxiliary layers such as an electron injection layer, an electron transport layer, a hole transport layer, and a hole injection layer may also be included above and below the light emitting layer 370. A hole injection layer and a hole transport layer may be positioned under the light emitting layer 370, and an electron transport layer and an electron injection layer may be positioned on the light emitting layer 370. Another light emitting layer may be further positioned on the light emitting layer 370. For example, two or more light emitting layers 370 may be stacked on each other.

Although not shown, a spacer may be further positioned on the bank layer 350. The spacer may include the same material as the bank layer 350. However, the disclosure is not limited thereto, and the spacer may be made of a different material from that of the bank layer 350. The spacer may be an organic insulating film including at least one of a polyimide, a polyamide, an acryl resin, benzocyclobutene, and a phenol resin.

The common electrode 270 may be positioned on the bank layer 350 and the light emitting layer 370. The common electrodes 270 of respective pixels PX1, PX2, and PX3 may be connected to each other. The common electrodes 270 may be entirely formed on the substrate 110 to be connected to each other. The common electrode 270 may also be referred to as a cathode, and may be formed of a transparent conductive layer including an indium tin oxide (ITO), an indium zinc oxide (IZO), an indium gallium zinc oxide (IGZO), and an indium tin zinc oxide (ITZO). The common electrode 270 may be made of a metal material such as silver (Ag) or magnesium (Mg), or a mixture thereof. The common electrode 270 may be formed as a transparent conductive layer by adjusting a thickness thereof. The common electrode 270 may have a translucent characteristic, and may form a micro-cavity together with the pixel electrode 191.

The pixel electrode 191, the light emitting layer 370, and the common electrode 270 may configure a light emitting element ED. A portion where the pixel electrode 191, the light emitting layer 370, and the common electrode 270 overlap in each of the pixels PX1, PX2, and PX3 may be a light emitting area of each light emitting element ED.

The light emitting element ED positioned on the first pixel PX1 may overlap the first color conversion layer 520a and the first color filter 230a. The light emitting element ED positioned in the first pixel PX1 may not overlap the second color conversion layer 520b, the transmission layer 520c, the second color filter 230b, and the third color filter 230c. Light emitted from the light emitting element ED of the first pixel PX1 may be converted into light of the first wavelength while passing through the first color conversion layer 520a, and may be emitted through the first color filter 230a to the outside.

The light emitting element ED positioned on the second pixel PX2 may overlap the second color conversion layer 520b and the second color filter 230b. The light emitting element ED positioned in the second pixel PX2 may not overlap the first color conversion layer 520a, the transmission layer 520c, the first color filter 230a, and the third color filter 230c. Light emitted from the light emitting element ED of the second pixel PX2 may be converted into light of the second wavelength while passing through the second color conversion layer 520b, and may be emitted through the second color filter 230b to the outside.

The light emitting element ED positioned in the third pixel PX3 may overlap the transmission layer 520c and the third color filter 230c. The light emitting element ED positioned in the third pixel PX3 may not overlap the first color conversion layer 520a, the second color conversion layer 520b, the first color filter 230a, and the second color filter 230b. The light of the third wavelength emitted from the light emitting element ED of the third pixel PX3 may pass sequentially through the transmission layer 520c and the third color filter 230c to be emitted to the outside.

The encapsulation layer 400 may be positioned on the common electrode 270. The encapsulation layer 400 may include at least one inorganic film and at least one organic film. In an embodiment, the encapsulation layer 400 may include a first inorganic encapsulation layer 410, an organic encapsulation layer 420, and a second inorganic encapsulation layer 430. However, this is only an example, and the number of inorganic and organic films configuring the encapsulation layer 400 may be variously changed. For example, the encapsulation layer 400 may be sequentially stacked in the order of a first inorganic encapsulation layer, a second inorganic encapsulation layer, a first organic encapsulation layer, and a third inorganic encapsulation layer. In other embodiments, the encapsulation layer 400 may be sequentially stacked in the order of the first inorganic encapsulation layer, the first organic encapsulation layer, the second inorganic encapsulation layer, and the third inorganic encapsulation layer. The display panel 1000 may include a display area for displaying a screen and a peripheral area surrounding the display area. A first inorganic encapsulation layer 410, an organic encapsulation layer 420, and a second inorganic encapsulation layer 430 may be partially positioned in the display area and the peripheral area. In some embodiments, the organic encapsulation layer 420 may be formed around the display area, and the first inorganic encapsulation layer 410 and the second inorganic encapsulation layer 430 may be formed even in the peripheral area. The encapsulation layer 400 may be to protect the light emitting element ED from moisture or oxygen that may be introduced from the outside, and end portions of the first inorganic encapsulation layer 410 and the second inorganic encapsulation layer 430 may be formed to contact (e.g., directly contact) each other.

The encapsulation layer 400 may be in contact with the color conversion panel 2000. The encapsulation layer 400 may be in contact with the filling layer 290. The second inorganic encapsulation layer 430 may be in contact with the filling layer 290. However, this is only an example, and another layer may be further positioned between the encapsulation layer 400 and the filling layer 290.

Although not shown, the display device according to an embodiment may further include a sensing part for sensing a touch. The sensing part may include sensing electrodes, and the sensing part may be positioned between the display panel 1000 and the color conversion panel 2000.

Hereinafter, a manufacturing method of a display device according to an embodiment will be described with further reference to FIG. 4 to FIG. 16.

FIG. 4 to FIG. 16 sequentially illustrate schematic perspective views or cross-sectional views of a manufacturing process of a display device according to an embodiment. FIG. 4, FIG. 6, FIG. 9, FIG. 11, FIG. 14, and FIG. 15 illustrate perspective views, and FIG. 5, FIG. 7, FIG. 8, FIG. 10, FIG. 12, FIG. 13, and FIG. 16 illustrate cross-sectional views. For convenience of description, illustration of some layers may be omitted in some drawings. In FIG. 4, FIG. 6, FIG. 9, FIG. 11, FIG. 14, and FIG. 15, illustrations of the first color filter, the second color filter, and the third color filter may be omitted.

Figure 4:
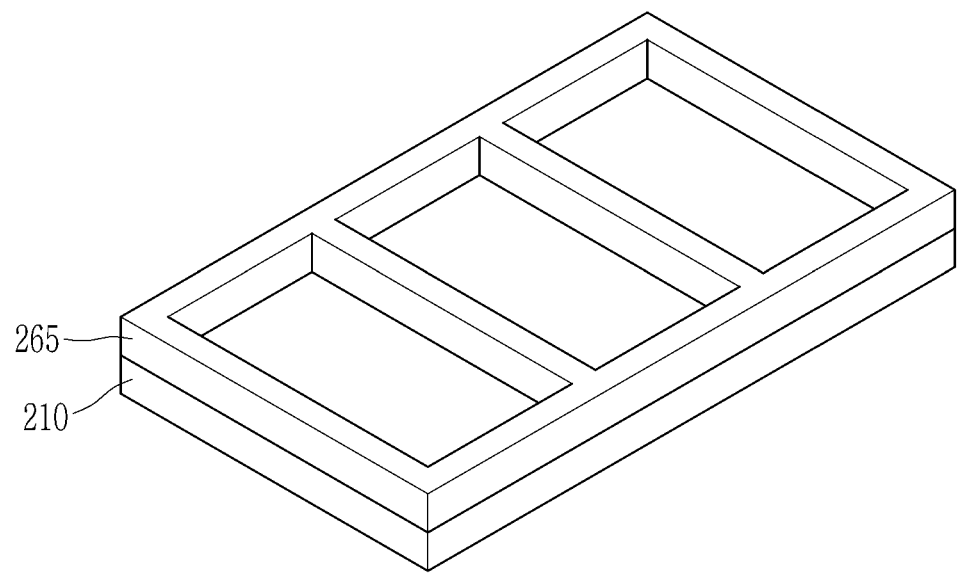
FIG. 4 to FIG. 16 sequentially illustrate schematic perspective views or cross-sectional views of a manufacturing process of a display device according to an embodiment.
Figure 5:
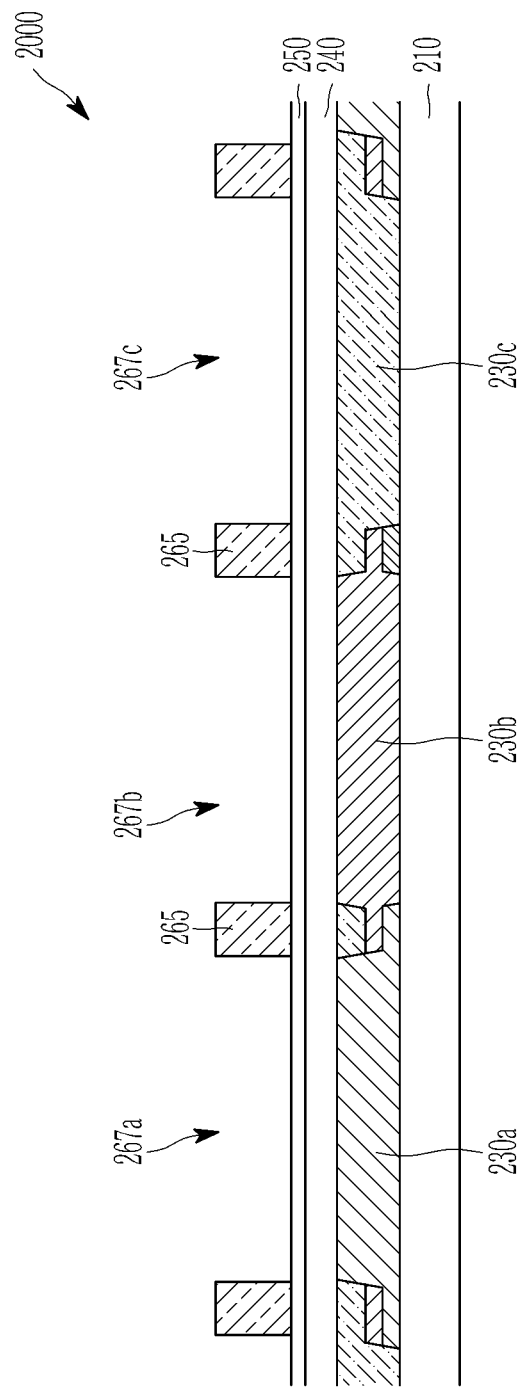

First, as shown in FIG. 4 and FIG. 5, the bank 265 defining the first opening 267a, the second opening 267b, and the third opening 267c may be formed on the substrate 210. The bank 265 may have a shape surrounding each of the first opening 267a, the second opening 267b, and the third opening 267c. For example, the first opening 267a, the second opening 267b, and the third opening 267c may be divided by the bank 265.

Before forming the bank 265, the first color filter 230a, the second color filter 230b, and the third color filter 230c may be sequentially formed on the substrate 210.

A material that may transmit the light of the first wavelength may be applied on the substrate 210, and the first color filter 230a may be formed by patterning the material. A material that may transmit the light of the second wavelength may be applied, and the second color filter 230b may be formed by patterning the material. A material that may transmit the light of the third wavelength may be applied, and the third color filter 230c may be formed by patterning the material.

In some areas, at least two of the first color filter 230a, the second color filter 230b, and the third color filter 230c may be formed to overlap each other. The first color filter 230a, the second color filter 230b, and the third color filter 230c may overlap each other to form a light blocking area.

The low refractive index layer 240 may be formed on the first color filter 230a, the second color filter 230b, and the third color filter 230c by using a material having a low refractive index. The low refractive index layer 240 may be entirely formed on the substrate 210, and a process for patterning may not be separately performed. The low refractive index layer 240 may include an organic material or inorganic material having a low refractive index of about 1.1 or more and about 1.3 or less.

The first capping layer 250 may be formed on the low refractive index layer 240 by using an inorganic material. The first capping layer 250 may be entirely formed on the substrate 210, and a process for patterning may not be separately performed. The first capping layer 250 may include an inorganic insulating material such as a silicon nitride (SiNx), a silicon oxide (SiOx), a silicon oxynitride (SiOxNy), or a combination thereof. The first capping layer 250 may have a single-layered structure or multi-layered structure of the above-described material.

After the first capping layer 250 may be formed, the bank 265 may be formed on the first capping layer 250. However, the disclosure is not limited thereto, and some processes may be omitted. For example, the process of forming the low refractive index layer 240 and the first capping layer 250 may be omitted.

Figure 6:
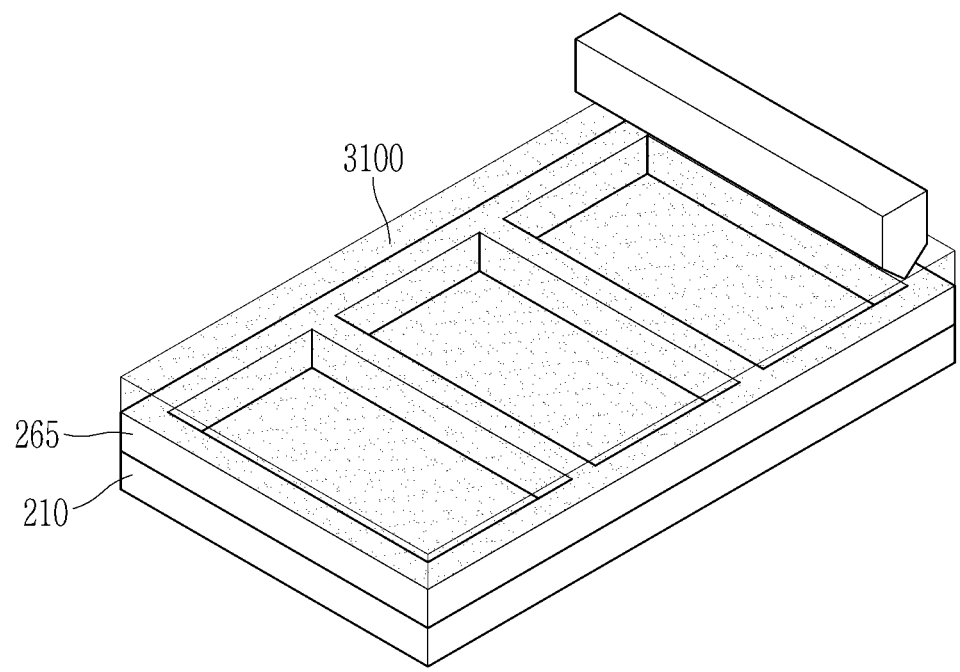
Figure 7:
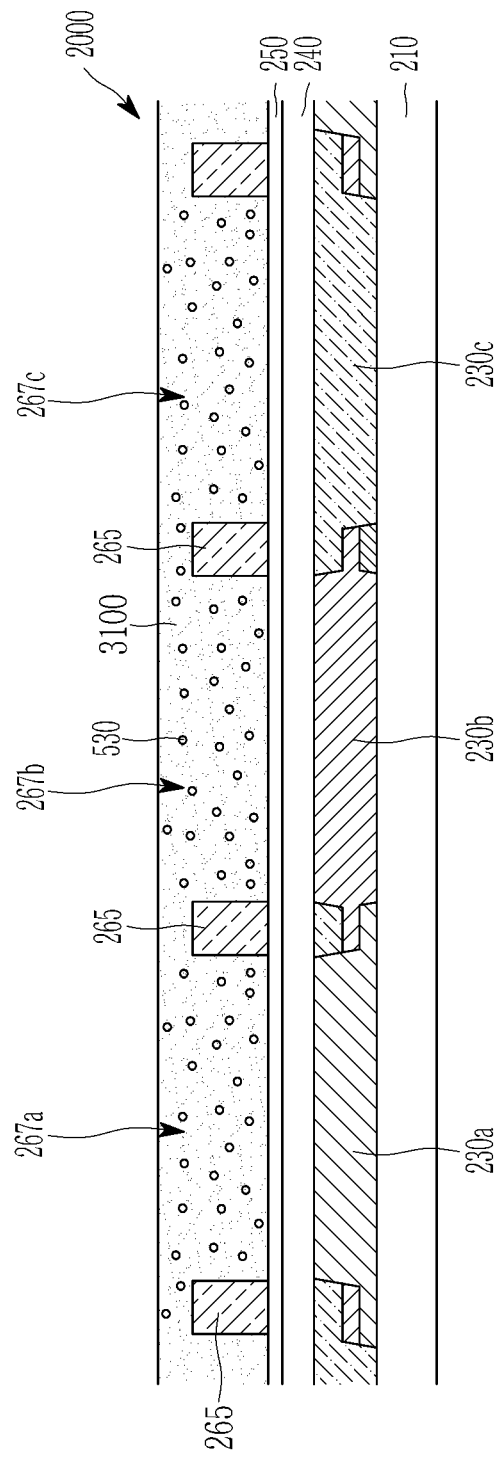

As shown in FIG. 6 and FIG. 7, a scatterer solution 3100 may be entirely coated on the substrate 210. The scatterer solution 3100 may be positioned within the first opening 267a, the second opening 267b, and the third opening 267c. The scatterer solution 3100 may be positioned on the bank 265.

The scatterer solution 3100 may include a volatile solvent, a first monomer, and the scatterer 530.

The volatile solvent may be a general-purpose solvent, and may include materials such as chloroform, acetone, propylene glycol methyl ether acetate ether acetate (PGMEA), propylene glycol monomethyl ether (PGME), or a combination thereof. The volatile solvent may have a boiling point of about 200° C. or higher and a vapor pressure of about $10^{-2}$ mmHg or less.

The first monomer may be made of a non-volatile monomer, and may be made of an organic material for photocuring. The first monomer may have an acrylate functional group at one end portion or both end portions thereof. The first monomer may have a boiling point of about 200° C. or higher and a vapor pressure of about $10^{-2}$ mmHg or less.

The scatterer 530 may include at least one material such as titanium oxide ($TiO_2$), silicon oxide ($SiO_2$), barium sulfate ($BaSO_4$), zinc oxide (ZnO), aluminum oxide ($Al_2O_3$), and calcium carbonate ($CaCO_3$). A particle size of the scatterer 530 may be greater than or equal to about 50 nm and less than or equal to about 800 nm.

The process of coating the scatterer solution 3100 may include an electrospray process, a screen printing process, a blade coating process, and the like. This is only one example, and the scatterer solution 3100 may be coated by various other methods.

Figure 8:
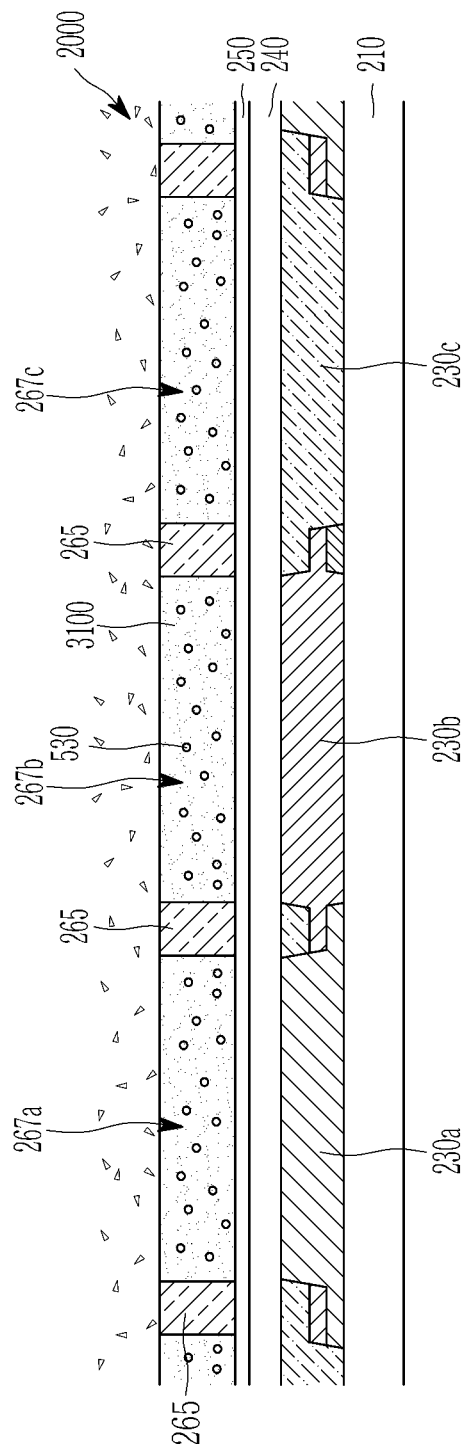

As shown in FIG. 8, the scatterer solution 3100 may be dried. The curing process may not be performed, and only the drying process may be performed. In case that the scatterer solution 3100 is dried, the volatile solvent of the scatterer solution 3100 may evaporate.

Figure 9:
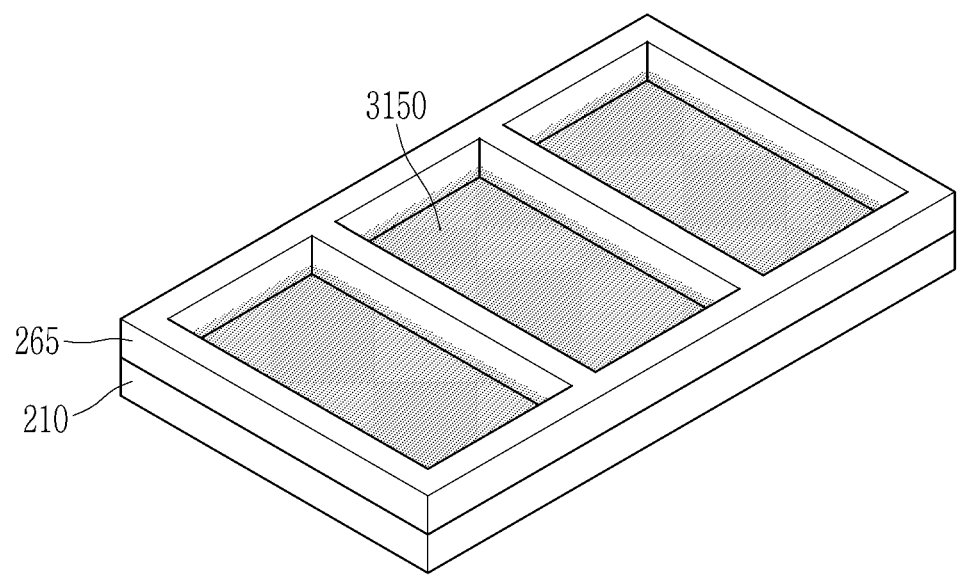
Figure 10:
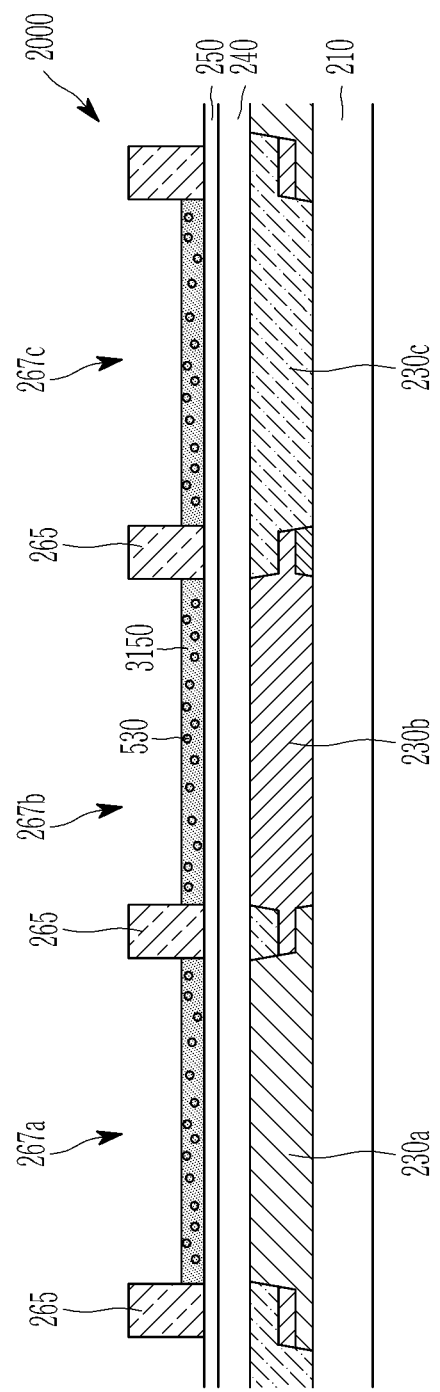

In case that the volatile solvent of the scatterer solution 3100 evaporates, the first monomer and the scatterer 530 of the scatterer solution 3100 remain as shown in FIG. 9 and FIG. 10 to form a scatterer layer 3150. For example, the scatterer layer 3150 may include the first monomer and the scatterer 530. The scatterer layer 3150 may be positioned within the first opening 267a, the second opening 267b, and the third opening 267c. The scatterer layer 3150 may be surrounded by the bank 265.

Figure 11:
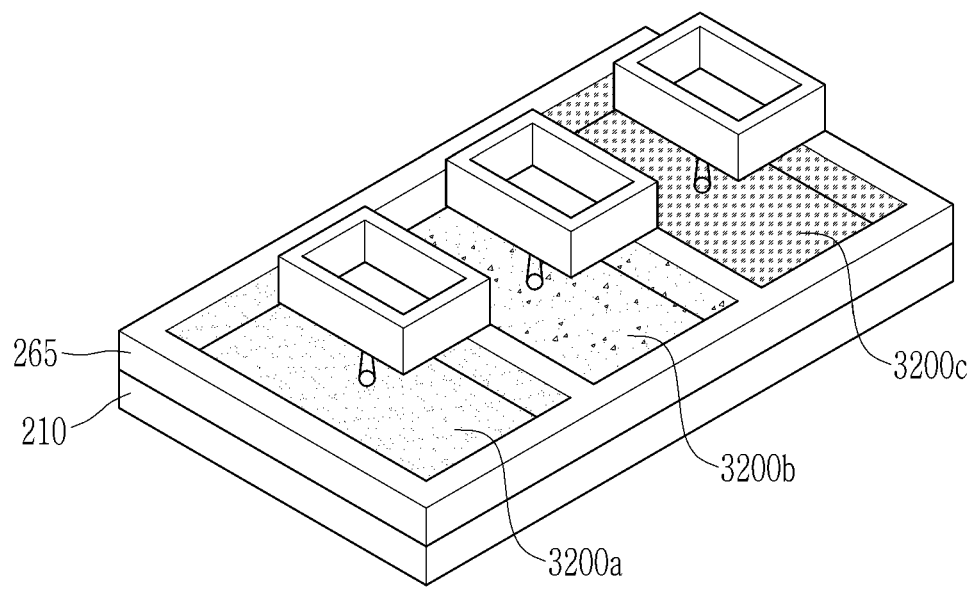
Figure 12:
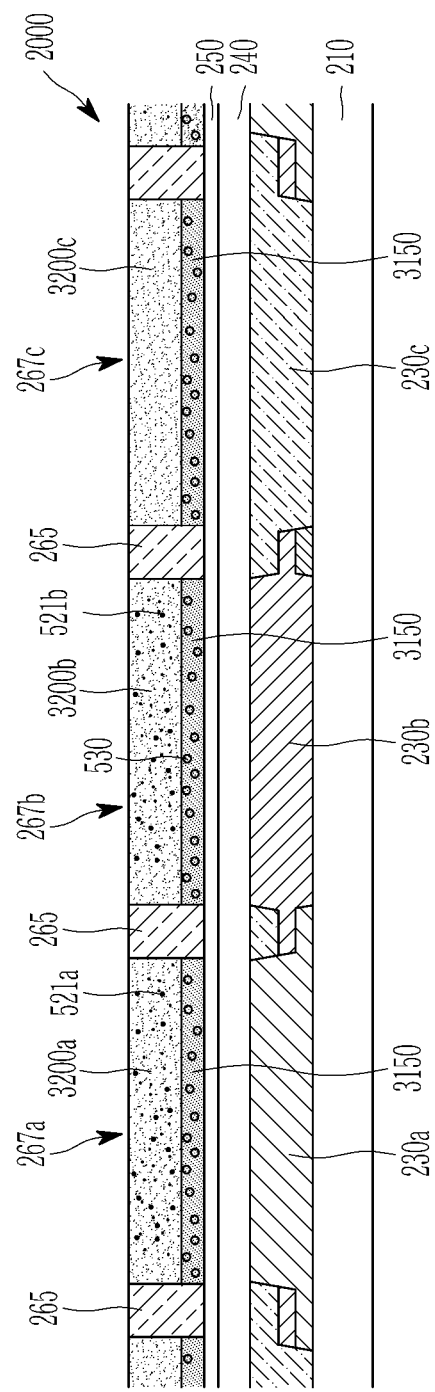

As shown in FIG. 11 and FIG. 12, the inkjet printing process may be performed to form a first ink layer 3200a in the first opening 267a, to form a second ink layer 3200b in the second opening 267b, and to form a third ink layer 3200c in the third opening 267c.

First, a nozzle of the inkjet printing device may be matched to the first opening 267a to discharge the first ink material to form the first ink layer 3200a in the first opening 267a. The first ink layer 3200a may include the first quantum dot 521a, a second monomer, and a photoinitiator. The first ink layer 3200a may further include other additives. The first ink layer 3200a may not include a scatterer.

The nozzle of the inkjet printing device may be matched to the second opening 267b to discharge a second ink material to form the second ink layer 3200b in the second opening 267b. The second ink layer 3200b may include the second quantum dot 521b, a second monomer, and a photoinitiator. The second ink layer 3200b may further include other additives. The second ink layer 3200b may not include a scatterer.

The nozzle of the inkjet printing device may be matched to the third opening 267c to discharge a third ink material to form the third ink layer 3200c in the third opening 267c. The third ink layer 3200c may include the second monomer and the photoinitiator. The third ink layer 3200c may further include other additives. The third ink layer 3200c may include no quantum dot. However, the disclosure is not limited thereto, and the third ink layer 3200c may further include a third quantum dot. The third ink layer 3200c may not include a scatterer.

One first opening 267a, one second opening 267b, and one third opening 267c are respectively illustrated on the substrate 210, but the disclosure is not limited thereto, and multiple first openings 267a, multiple second openings 267b, and multiple third openings 267c may be repeatedly disposed on the substrate 210. The ink material may be respectively discharged into the first openings 267a, the second openings 267b, and the third openings 267c while moving the nozzle of the inkjet printing device. Accordingly, the first ink layer 3200a may be formed in the first openings 267a, the second ink layer 3200b may be formed in the second openings 267b, and the third ink layer 3200c may be formed in the third openings 267c.

Each of the first quantum dot 521a and the second quantum dot 521b may independently include a group II-VI compound, a group III-V compound, a group IV-VI compound, a group IV element or compound, a group I-III-VI compound, a group II-III-VI compound, a group I-II-IV-VI compound, or a combination thereof.

The second monomer may be made of a non-volatile monomer, and may be made of an organic material for photocuring. The second monomer may have an acrylate functional group at one end portion or both end portions thereof. The second monomer may have a boiling point of about 200° C. or higher and a vapor pressure of about $10^{-2}$ mmHg or less. The first monomer and the second monomer may include the same material or different materials.

The photoinitiator may include a material for initiating photocuring. Accordingly, in case that UV light is irradiated to the first ink layer 3200a, the second ink layer 3200b, and the third ink layer 3200c, a photocuring process may be performed.

Other additives may include, for example, materials that aid in photocuring. However, the disclosure is not limited thereto, and other additives may include various materials.

Figure 13:
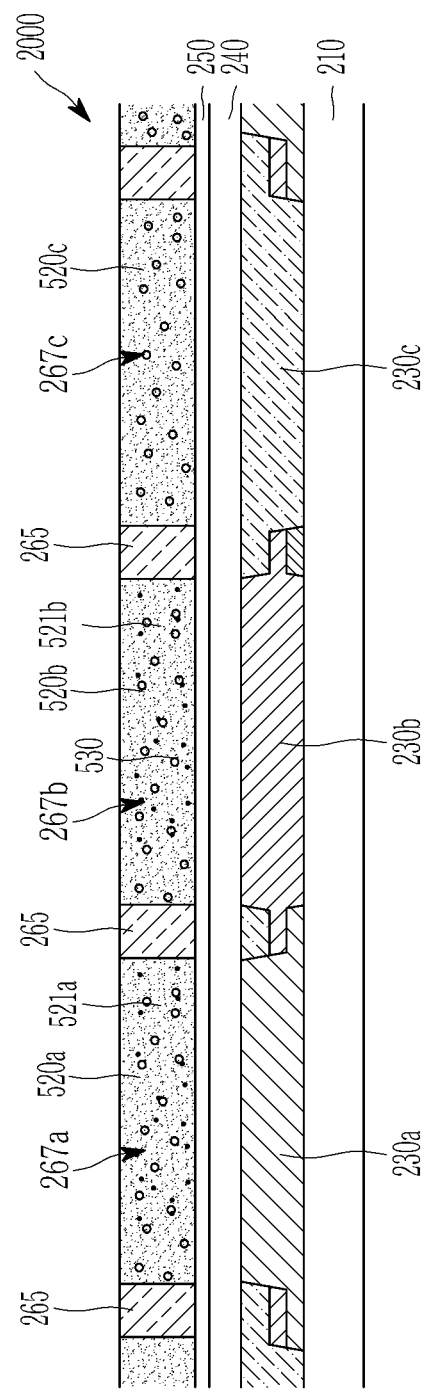

The scatterer layer 3150 positioned within the first opening 267a, the second opening 267b, and the third opening 267c may have a relatively high concentration in a state in which the solvent may be evaporated, and may have fluidity in a state before curing. The first ink layer 3200a positioned within the first opening 267a, the second ink layer 3200b positioned within the second opening 267b, and the third ink layer 3200c positioned within the third opening 267c may have a relatively low concentration, and may have fluidity. Two layers having different concentrations and having fluidity may be mixed to form the first color conversion layer 520a, the second color conversion layer 520b, and the transmission layer 520c as shown in FIG. 13.

In the first opening 267a, the scatterer layer 3150 and the first ink layer 3200a may be mixed with each other due to a difference in concentration. In the first opening 267a, the first color conversion layer 520a having a medium concentration made of a material in which the scatterer layer 3150 and the first ink layer 3200a are mixed may be formed. For example, the first color conversion layer 520a may include the scatterer 530, the first quantum dot 521a, the first monomer, the second monomer, the photoinitiator, and the like.

In the second opening 267b, the scatterer layer 3150 and the second ink layer 3200b may be mixed with each other due to a difference in concentration. In the second opening 267b, the second color conversion layer 520b having a medium concentration made of a material in which the scatterer layer 3150 and the second ink layer 3200b are mixed may be formed. For example, the second color conversion layer 520b may include the scatterer 530, the second quantum dot 521b, the first monomer, the second monomer, the photoinitiator, and the like.

In the third opening 267c, the scatterer layer 3150 and the third ink layer 3200c may be mixed with each other due to a difference in concentration. In the third opening 267c, the transmission layer 520c having a medium concentration made of a material in which the scatterer layer 3150 and the third ink layer 3200c are mixed may be formed. For example, the transmission layer 520c may include the scatterer 530, the first monomer, the second monomer, the photoinitiator, and the like.

In the process of forming the first color conversion layer 520a, the second color conversion layer 520b, and the transmission layer 520c, heat may be applied so that two different layers may be more smoothly mixed. For example, low temperature heat of about 100 degrees may be applied to a lower portion of the substrate 210.

Figure 14:
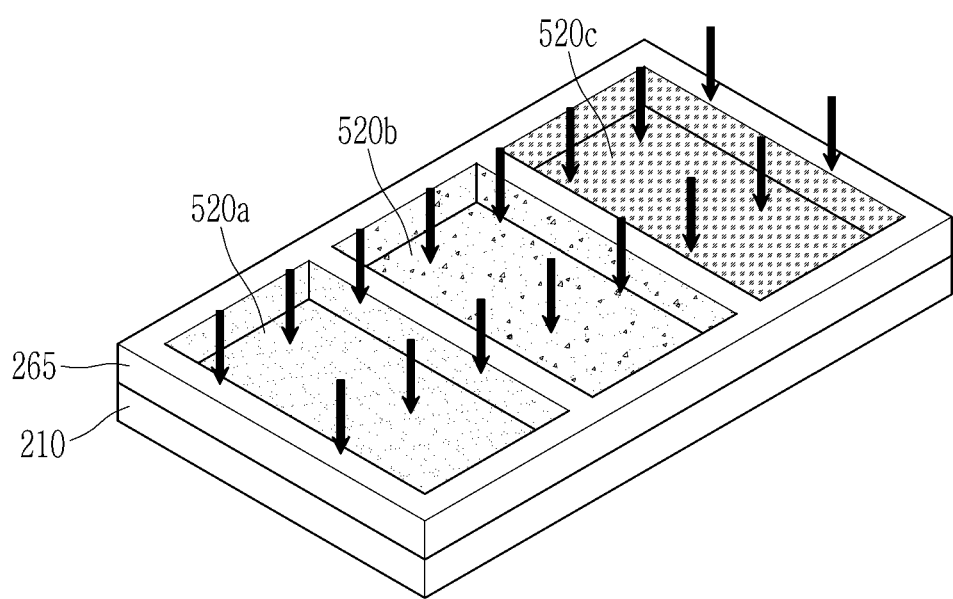

As shown in FIG. 14, by irradiating UV light on an upper portion of the substrate 210, the first color conversion layer 520a, the second color conversion layer 520b, and the transmission layer 520c may be photocured.

Figure 15:
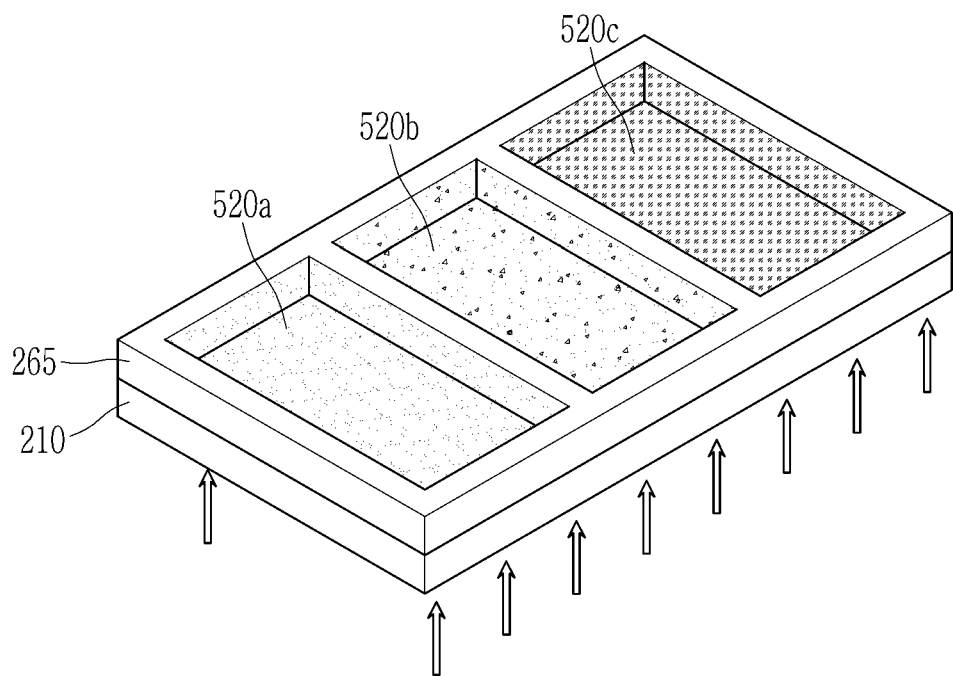

As shown in FIG. 15, by applying heat to the lower portion of the substrate 210, the first color conversion layer 520a, the second color conversion layer 520b, and the transmission layer 520c may be thermally cured. The thermal curing may be performed at a high temperature of about 180 degrees or more. In some cases, the thermal curing process may be omitted.

Figure 16:
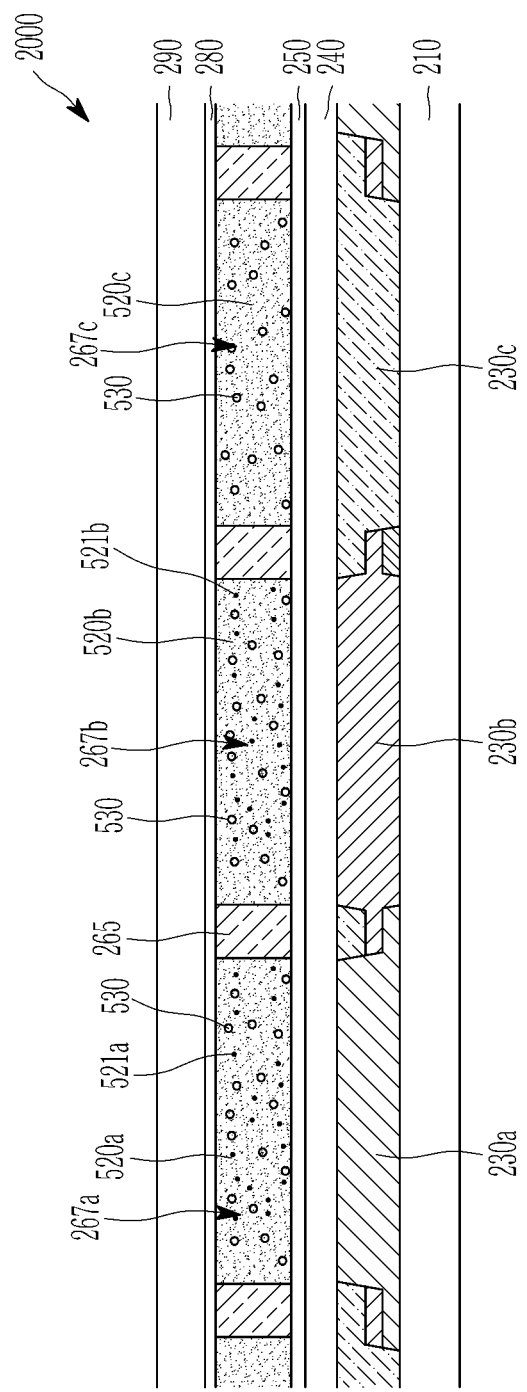

As shown in FIG. 16, the second capping layer 280 may be formed by using an inorganic material on the first color conversion layer 520a, the second color conversion layer 520b, the transmission layer 520c, and the bank 265. The second capping layer 280 may be entirely formed on the substrate 210, and a process for patterning may not be separately performed. The second capping layer 280 may include an inorganic insulating material such as a silicon nitride (SiNx), a silicon oxide (SiOx), a silicon oxynitride (SiOxNy), or a combination thereof. The second capping layer 280 may have a single-layered structure or multi-layered structure of the above-described material. The first opening 267a, the second opening 267b, and the third opening 267c may be sealed by the second capping layer 280.

The filling layer 290 may be formed on the second capping layer 280. The filling layer 290 may be entirely formed on the second capping layer 280, and a process for patterning may not be separately performed.

The color conversion panel 2000 may be formed as described above, and the display panel 1000 may be formed separately therefrom. The display panel 1000 and the color conversion panel 2000 may be aligned to face each other and may be bonded together.

The display device according to an embodiment may have a structure in which the first color conversion layer 520a includes the first quantum dot 521a and the scatterer 530, the second color conversion layer 520b includes the second quantum dot 521b and the scatterer 530, and the transmission layer 520c includes the scatterer 530. The manufacturing method of the display device according to the reference example in which the first color conversion layer 520a may be formed by discharging the ink including the first quantum dot 521a and the scatterer 530 into the first opening 267a by using the inkjet printing method may be considered. Similarly, the second color conversion layer 520b may be formed by discharging the ink including the second quantum dot 521b and the scatterer 530 into the second opening 267b, and the transmission layer 520c may be formed by discharging the ink including the scatterer 530 into the third opening 267c. By using the ink including the scatterer 530, the scatterer may be precipitated in the ink or be adsorbed to the inner wall of the nozzle, which may cause ink error-landing defects or change in the content of the scatterer according to the nozzle position.

In the display device according to an embodiment, the scatterer layer 3150 including the scatterer 530 may be entirely formed by using a separate coating process, and the first ink layer 3200a, the second ink layer 3200b, and the third ink layer 3200c may be formed by using an ink not including the scatterer 530. Since the scatterer 530 may not be included in the ink, it may be possible to solve the problem caused by the scatterer being precipitated in the ink or adsorbed on the inner wall of the nozzle. It may be possible to solve the problem of staining on the display device as a concentration of the scatterers in nozzles of an inkjet head of the inkjet printing device may be non-uniform. For example, it may be possible to prevent the ink from erroneously landing, and to allow the content of the scatterers to be constant as a whole. The scatterer layer 3150 and the first ink layer 3200a may be mixed to form the first color conversion layer 520a, the scatterer layer 3150 and the second ink layer 3200b may be mixed to form the second color conversion layer 520b, and the scatterer layer 3150 and the third ink layer 3200c may be mixed to form the transmission layer 520c.

Hereinafter, a structural difference between a display device manufactured by a manufacturing method of a display device according to an embodiment to be described with reference to FIG. 17 and FIG. 18 and a display device manufactured by a manufacturing method of a display device according to a comparative example will be described.

Figure 17:
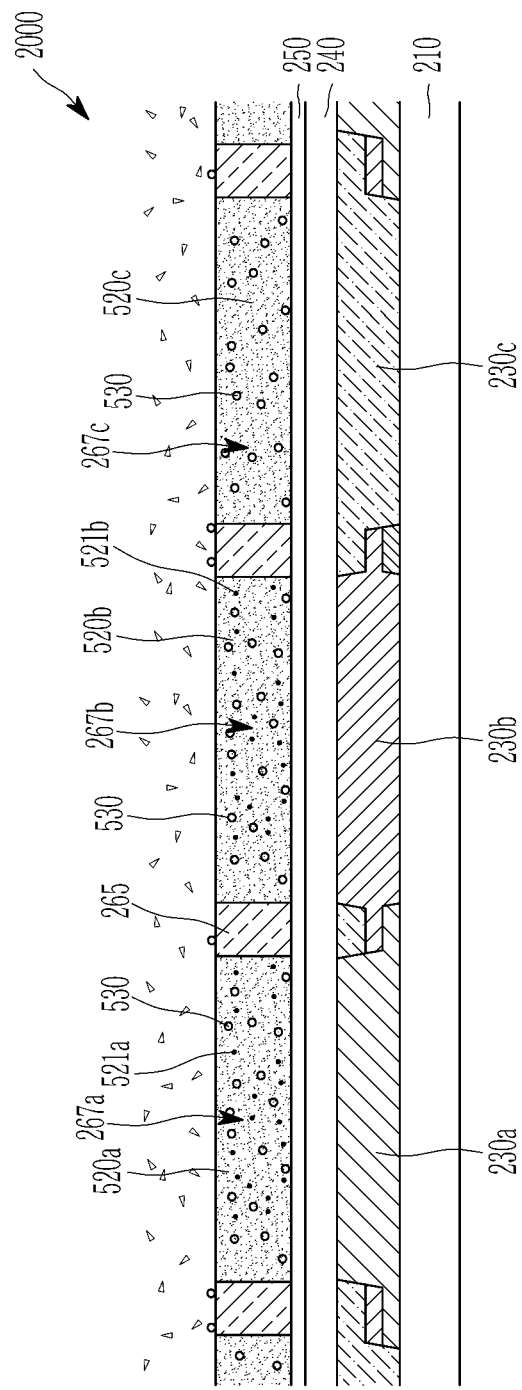
FIG. 17 illustrates a schematic cross-sectional view of specific steps in a manufacturing process of a display device according to an embodiment.
Figure 18:
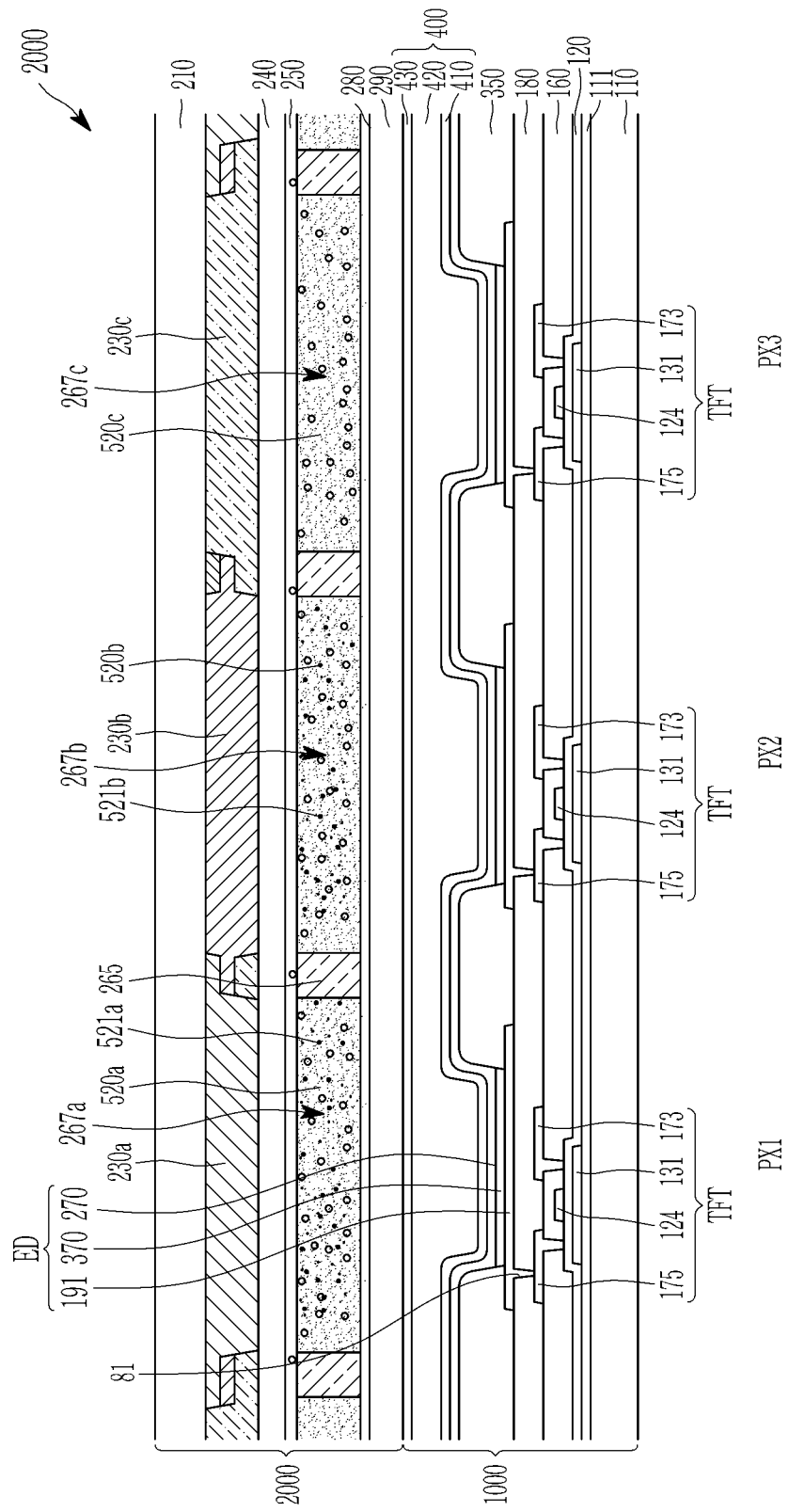
FIG. 18 illustrates a schematic cross-sectional view of a display device according to an embodiment.

FIG. 17 illustrates a schematic cross-sectional view of specific steps in a manufacturing process of a display device according to an embodiment, and FIG. 18 illustrates a schematic cross-sectional view of a display device according to an embodiment. FIG. 17 illustrates a process in which the solvent may be evaporated from the scatterer solution 3100.

As shown in FIG. 17 and FIG. 18, in case that the scatterer solution 3100 is entirely coated and the volatile solvent is evaporated, the scatterer 530 may remain on the bank 265. In case that the process of forming the color conversion layer by dropping the ink including the scatterer and quantum dot into the opening is performed, the scatterer may be positioned only within the opening, and the scatterer may not be positioned on the bank. In the display device according to an embodiment, since the scatterer layer may be entirely formed by using a separate process, the scatterer 530 may be positioned not only within the first opening 267a, the second opening 267b, and the third opening 267c, but also on the bank 265.

In the manufacturing method of the display device according to an embodiment, the first monomer included in the scatterer solution used in the process of forming the scatterer layer and the second monomer included in the first to third ink layers may include the same material, or may include different materials. Accordingly, the first color conversion layer 520a, the second color conversion layer 520b, and the transmission layer 520c may include a single monomer, or two or more monomers.

Hereinafter, a display device and a manufacturing method thereof according to an embodiment will be described with reference to FIG. 19 and FIG. 20.

Figure 19:
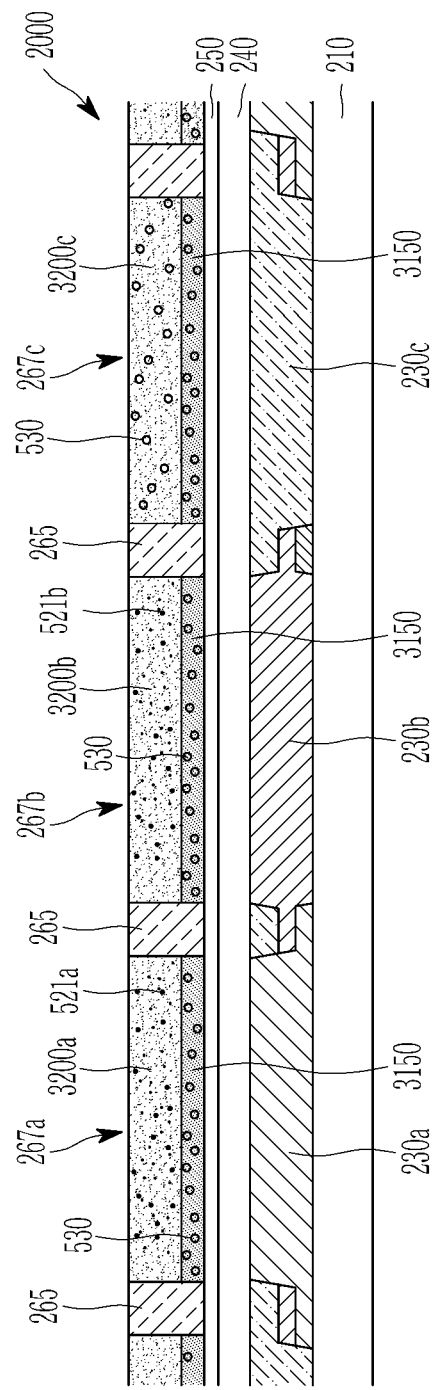
FIG. 19 illustrates a schematic cross-sectional view of specific steps in a manufacturing process of a display device according to an embodiment.
Figure 20:
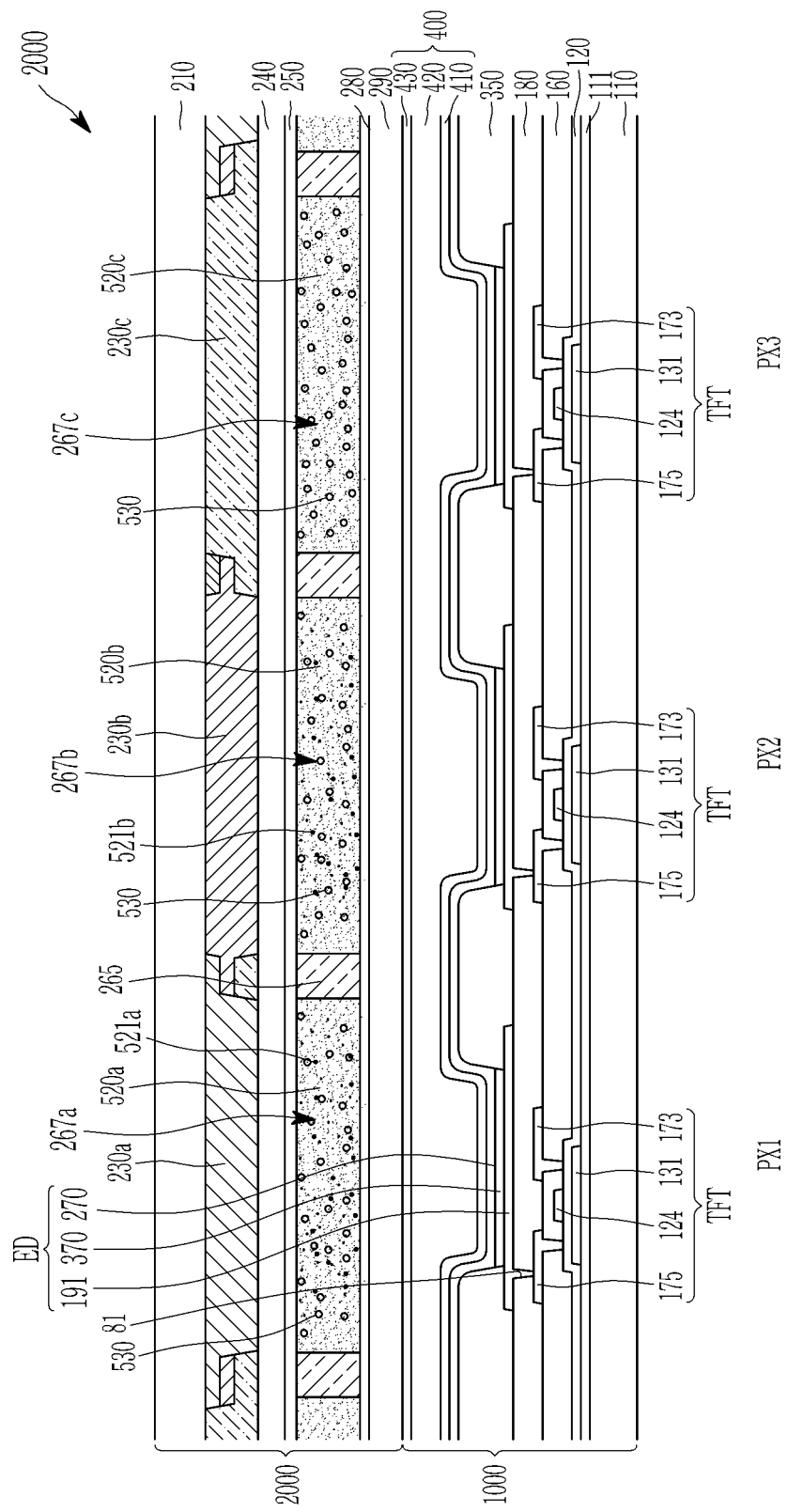
FIG. 20 illustrates a schematic cross-sectional view of a display device according to an embodiment.

The display device and the manufacturing method thereof according to an embodiment shown in FIG. 19 and FIG. 20 may be mostly the same as the display device and the manufacturing method thereof according to an embodiment shown in FIG. 1 to FIG. 16, so the description of the same components will be omitted. An embodiment may differ from a previous embodiment at least in that a content of the scatterers positioned within the third opening may be relatively high, which will be further described below.

FIG. 19 illustrates a schematic cross-sectional view of specific steps in a manufacturing process of a display device according to an embodiment, and FIG. 20 illustrates a schematic cross-sectional view of a display device according to an embodiment.

Like the previous embodiment, the bank 265 defining the first opening 267a, the second opening 267b, and the third opening 267c may be formed; the scatterer layer 3150 may be respectively formed in the first opening 267a, the second opening 267b, and the third opening 267c; the first ink layer 3200a may be formed in the first opening 267a; the second ink layer 3200b may be formed in the second opening 267b; and the third ink layer 3200c may be formed in the third opening 267c.

Subsequently, as shown in FIG. 19, the scatterer 530 may be further formed in the third opening 267c. The inkjet printing process may be additionally performed to discharge the ink material including the scatterer 530 into the third opening 267c. In other embodiments, in the process of forming the third ink layer 3200c in the third opening 267c, the third ink layer 3200c including the scatterer 530 may be formed by allowing the third ink material to include the scatterer 530. For example, in a previous embodiment, the third ink layer 3200c may not include the scatterer, while in another embodiment, the third ink layer 3200c may include the scatterer 530.

Accordingly, in the display device manufactured according to an embodiment, as shown in FIG. 20, the content of the scatterers 530 positioned in the third opening 267c may be different from that of the scatterers 530 positioned in the first opening 267a. Similarly, the content of the scatterers 530 positioned in the third opening 267c may be different from that of the scatterers 530 positioned in the second opening 267b. Since the additional injection process of the scatterer 530 into the third opening 267c may be performed, the content of the scatterer 530 positioned in the third opening 267c may be relatively high. For example, the content of the scatterers 530 positioned in the third opening 267c may be larger than that of the scatterers 530 positioned in the first opening 267a. The content of the scatterers 530 positioned in the third opening 267c may be larger than that of the scatterers 530 positioned in the second opening 267b.

Hereinafter, a display device and a manufacturing method thereof according to an embodiment will be described with reference to FIG. 21 and FIG. 22.

Figure 21:
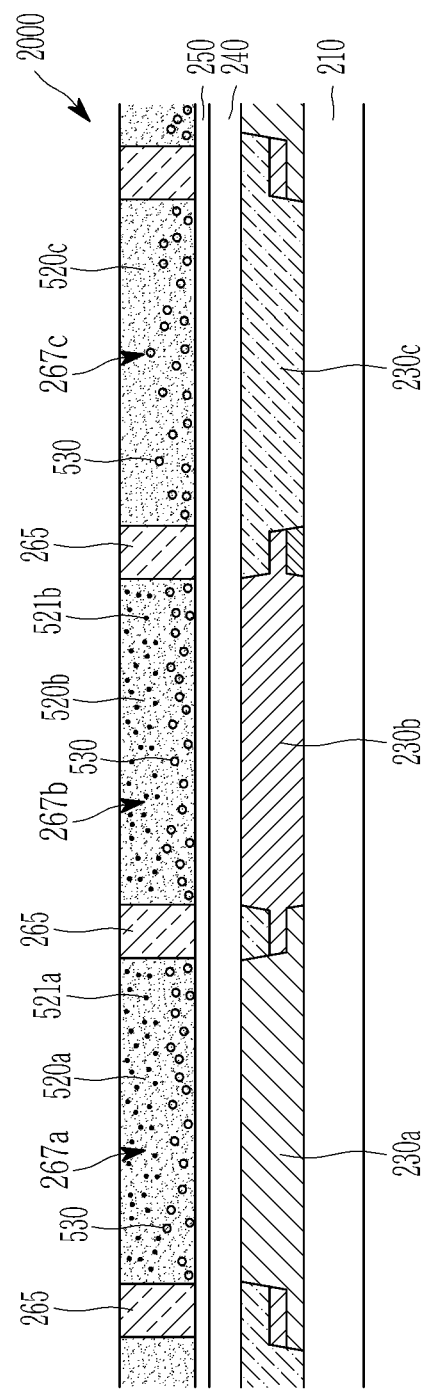
FIG. 21 illustrates a schematic cross-sectional view of specific steps in a manufacturing process of a display device according to an embodiment.
Figure 22:
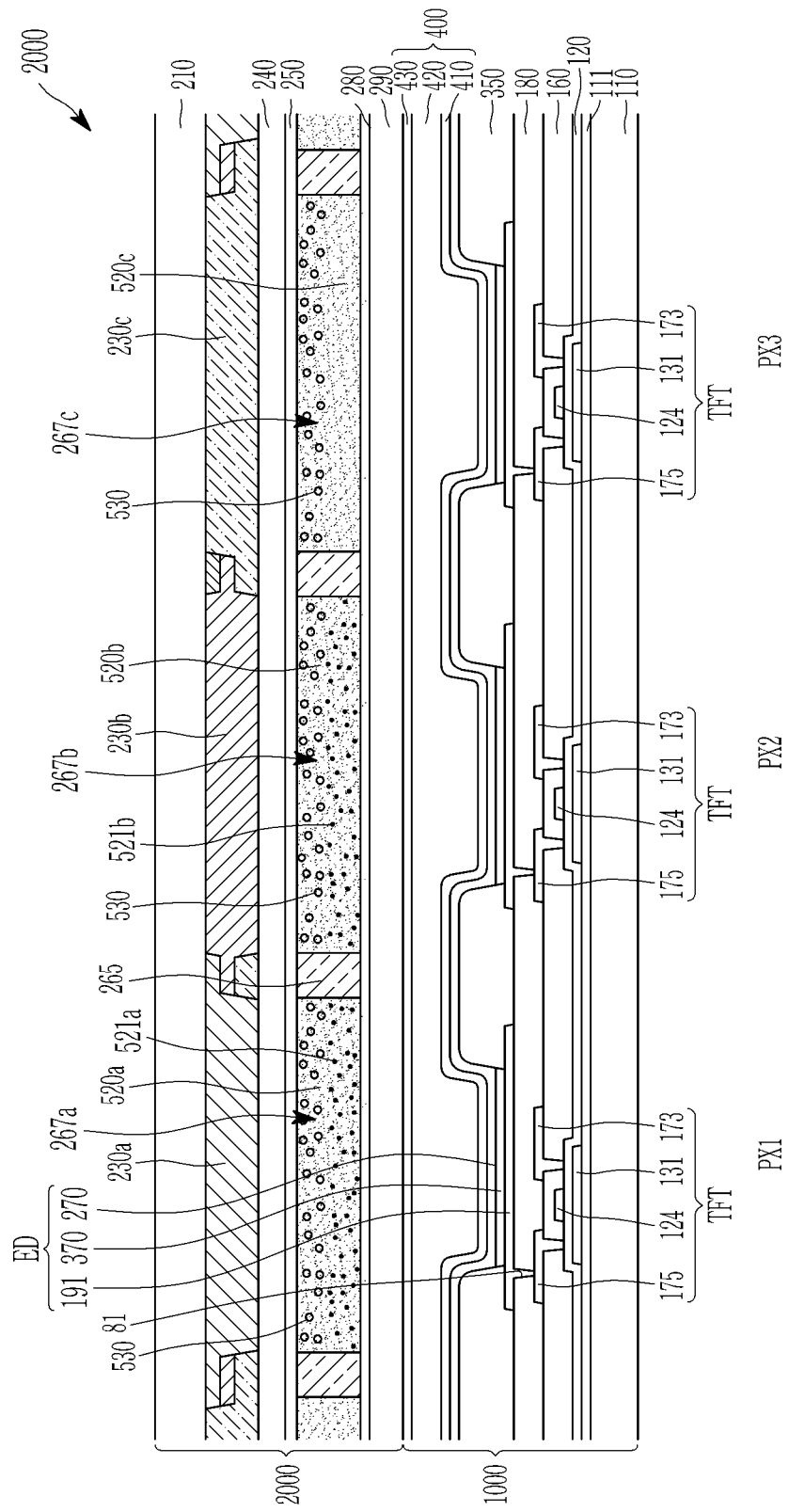
FIG. 22 illustrates a schematic cross-sectional view of a display device according to an embodiment.

The display device and the manufacturing method thereof according to an embodiment shown in FIG. 21 and FIG. 22 may be mostly the same as the display device and the manufacturing method thereof according to an embodiment shown in FIG. 1 to FIG. 16, so the description of the same components will be omitted. An embodiment may be different from a previous embodiment in that some of the layers positioned in the first opening, the second opening, and the third opening may not be mixed, which will be described in detail below.

FIG. 21 illustrates a schematic cross-sectional view of specific steps in a manufacturing process of a display device according to an embodiment, and FIG. 22 illustrates a schematic cross-sectional view of a display device according to an embodiment.

Like the previous embodiment, in the display device according to the embodiment, the bank 265 defining the first opening 267a, the second opening 267b, and the third opening 267c may be formed; the scatterer layer may be formed in each of the first opening 267a, the second opening 267b, and the third opening 267c; the first ink layer may be formed in the first opening 267a; the second ink layer may be formed in the second opening 267b; and the third ink layer may be formed in the third opening 267c.

Subsequently, as shown in FIG. 21, the scatterer layer and the first ink layer may be mixed in the first opening 267a to form the first color conversion layer 520a. The scatterer layer and the second ink layer may be mixed in the second opening 267b to form the second color conversion layer 520b. The scatterer layer and the third ink layer may be mixed in the third opening 267c to form the transmission layer 520c. These mixing processes may not be smoothly performed.

Accordingly, as shown in FIG. 22, in the display device manufactured according to an embodiment, a ratio of the scatterer 530 to the first quantum dot 521a may be different depending on the positions thereof in the first color conversion layer 520a. For example, a concentration of the scatterers 530 in the portion close to the substrate 210 in the first color conversion layer 520a may be higher than that of the scatterers 530 in the portion far from the substrate 210 therein. In the first color conversion layer 520a, a concentration of the first quantum dots 521a in a portion close to the substrate 210 may be lower than that of the first quantum dots 521a in a portion far from the substrate 210.

A ratio between the scatterers 530 and the second quantum dots 521b may be different according to the positions thereof in the second color conversion layer 520b. For example, the concentration of the scatterers 530 in the portion close to the substrate 210 in the second color conversion layer 520b may be higher than that of the scatterers 530 in the portion far from the substrate 210 therein. The concentration of the second quantum dots 521b in the portion close to the substrate 210 in the second color conversion layer 520b may be lower than that of the second quantum dots 521b in the portion far from the substrate 210 therein.

The ratio of the scatterers 530 may be different depending on the position thereof in the transmission layer 520c. For example, the concentration of the scatterers 530 in the portion close to the substrate 210 in the transmission layer 520c may be higher than that of the scatterers 530 in the portion far from the substrate 210 therein.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure.

What is claimed is:

1. A manufacturing method of a display device, comprising:
 forming a bank separating a first opening, a second opening, and a third opening on a first substrate;
 forming a scatterer layer including scatterers in the first opening, the second opening, and the third opening;
 forming a first ink layer including a first quantum dot in the first opening;
 forming a second ink layer including a second quantum dot in the second opening; and
 forming a third ink layer in the third opening, wherein
 the scatterer layer and the first ink layer are mixed to form a first color conversion layer in the first opening,
 the scatterer layer and the second ink layer are mixed to form a second color conversion layer in the second opening,
 the scatterer layer and the third ink layer are mixed to form a transmission layer in the third opening, and
 the first color conversion layer is a single layer in which the scatterers and the first quantum dots are intermingled.

2. The manufacturing method of the display device of claim 1, wherein the forming of the scatterer layer includes:
 coating a scatterer solution entirely on the first substrate, and
 forming a scatterer layer by drying the scatterer solution.

3. A manufacturing method of a display device, comprising:
 forming a bank separating a first opening, a second opening, and a third opening on a first substrate;
 forming a scatterer layer in the first opening, the second opening, and the third opening;
 forming a first ink layer in the first opening;
 forming a second ink layer in the second opening; and
 forming a third ink layer in the third opening, wherein
 the scatterer layer and the first ink layer are mixed to form a first color conversion layer in the first opening,
 the scatterer layer and the second ink layer are mixed to form a second color conversion layer in the second opening,
 the scatterer layer and the third ink layer are mixed to form a transmission layer in the third opening,
 the forming of the scatterer layer includes:
  coating a scatterer solution entirely on the first substrate, and
  forming a scatterer layer by drying the scatterer solution,
 the scatterer solution includes a volatile solvent, a first monomer, and a scatterer,
 when the scatterer solution is dried, the volatile solvent evaporates, and
 the scatterer layer includes the first monomer and the scatterer.

4. The manufacturing method of the display device of claim 3, wherein the volatile solvent includes at least one of chloroform, acetone, propylene glycol methyl ether acetate (PGMEA), and propylene glycol monomethyl ether (PGME).

5. The manufacturing method of the display device of claim 3, wherein the first monomer includes an organic material provided with an acrylate functional group at at least one end portion of the organic material.

6. The manufacturing method of the display device of claim 3, wherein the scatterer includes at least one of titanium oxide ($TiO_2$), silicon oxide ($SiO_2$), barium sulfate ($BaSO_4$), zinc oxide (ZnO), aluminum oxide ($Al_2O_3$), and calcium carbonate ($CaCO_3$).

7. The manufacturing method of the display device of claim 3, wherein the scatterer is further disposed on the bank.

8. The manufacturing method of the display device of claim 3, wherein
 the first ink layer includes a first quantum dot, a second monomer, and a photoinitiator;
 the second ink layer includes a second quantum dot, the second monomer, and the photoinitiator;
 the third ink layer includes the second monomer and the photoinitiator; and
 the first ink layer, the second ink layer, and the third ink layer do not include a scatterer.

9. The manufacturing method of the display device of claim 8, wherein the first monomer and the second monomer include different materials.

10. The manufacturing method of the display device of claim 8, wherein the second monomer includes an organic material provided with an acrylate functional group at at least one end portion of the organic material.

11. A manufacturing method of a display device, comprising:
 forming a bank separating a first opening, a second opening, and a third opening on a first substrate;
 forming a scatterer layer in the first opening, the second opening, and the third opening;
 forming a first ink layer in the first opening;
 forming a second ink layer in the second opening; and
 forming a third ink layer in the third opening, wherein
 the scatterer layer and the first ink layer are mixed to form a first color conversion layer in the first opening,
 the scatterer layer and the second ink layer are mixed to form a second color conversion layer in the second opening,
 the scatterer layer and the third ink layer are mixed to form a transmission layer in the third opening,
 the forming of the scatterer layer includes:
  coating a scatterer solution entirely on the first substrate, and
  forming a scatterer layer by drying the scatterer solution, and
 the coating of the scatterer solution is performed by using at least one of an electrospray process, a screen printing process, and a blade coating process.

12. The manufacturing method of the display device of claim 11, wherein the forming of the first ink layer, the second ink layer, and the third ink layer is performed by using an inkjet printing process.

13. The manufacturing method of the display device of claim 2, further comprising:
 photocuring the first color conversion layer, the second color conversion layer, and the transmission layer; and
 thermal-curing the first color conversion layer, the second color conversion layer, and the transmission layer.

14. The manufacturing method of the display device of claim 1, further comprising
 forming a first color filter, a second color filter, and a third color filter on the first substrate, wherein
 the first color filter overlaps the first color conversion layer in a plan view,
 the second color filter overlaps the second color conversion layer in a plan view, and
 the third color filter overlaps the transmission layer in a plan view.

15. The manufacturing method of the display device of claim 1, further comprising:
- forming light emitting elements on a second substrate;
- aligning the first substrate and the second substrate to face each other; and
- bonding the first substrate and the second substrate together.

* * * * *